(12) United States Patent
Nasalevich et al.

(10) Patent No.: US 10,908,496 B2
(45) Date of Patent: Feb. 2, 2021

(54) MEMBRANE FOR EUV LITHOGRAPHY

(71) Applicant: ASML NETHERLANDS B.V., Veldhoven (NL)

(72) Inventors: Maxim Aleksandrovich Nasalevich, Eindhoven (NL); Erik Achilles Abegg, Eindhoven (NL); Nirupam Banerjee, Eindhoven (NL); Michiel Alexander Blauw, Breda (NL); Derk Servatius Gertruda Brouns, Herentals (BE); Paul Janssen, Eindhoven (NL); Matthias Kruizinga, Herten (NL); Egbert Lenderink, Waalre (NL); Nicolae Maxim, Eindhoven (NL); Andrey Nikipelov, Eindhoven (NL); Arnoud Willem Notenboom, Rosmalen (NL); Claudia Piliego, Eindhoven (NL); Mária Péter, Eindhoven (NL); Gijsbert Rispens, Eersel (NL); Nadja Schuh, Eindhoven (NL); Marcus Adrianus Van De Kerkhof, Helmond (NL); Willem Joan Van Der Zande, Bussum (NL); Pieter-Jan Van Zwol, Eindhoven (NL); Antonius Willem Verburg, Eindhoven (NL); Johannes Petrus Martinus Bernardus Vermeulen, Leende (NL); David Ferdinand Vles, Eindhoven (NL); Willem-Pieter Voorthuijzen, 's-Hertogenbosch (NL); Aleksandar Nikolov Zdravkov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 148 days.

(21) Appl. No.: 16/093,537

(22) PCT Filed: Apr. 12, 2017

(86) PCT No.: PCT/EP2017/058721
§ 371 (c)(1),
(2) Date: Oct. 12, 2018

(87) PCT Pub. No.: WO2017/186486
PCT Pub. Date: Nov. 2, 2017

(65) Prior Publication Data
US 2019/0129299 A1    May 2, 2019

(30) Foreign Application Priority Data

| Apr. 25, 2016 | (EP) | 16166775 |
| Oct. 21, 2016 | (EP) | 16195123 |
| Dec. 20, 2016 | (EP) | 16205298 |

(51) Int. Cl.
*G03F 1/62* (2012.01)
*G03F 7/20* (2006.01)
(Continued)

(52) U.S. Cl.
CPC ............ *G03F 1/62* (2013.01); *G02B 5/208* (2013.01); *G02B 5/283* (2013.01); *G03F 1/82* (2013.01);
(Continued)

(58) Field of Classification Search
CPC .......... G03F 1/62; G03F 1/82; G03F 7/70916; G03F 7/70958; G03F 7/70575
See application file for complete search history.

(56) References Cited

U.S. PATENT DOCUMENTS

| 5,741,576 A | 4/1998 | Kuo |
| 2012/0147350 A1 | 6/2012 | Yakunin et al. |

(Continued)

FOREIGN PATENT DOCUMENTS

| JP | H11109603 | 4/1999 |
| JP | 2016021078 | 2/2016 |

(Continued)

OTHER PUBLICATIONS

Search Report issued in corresponding Netherlands Patent Application No. 2022557, dated Jul. 11, 2019.
(Continued)

*Primary Examiner* — Stewart A Fraser
(74) *Attorney, Agent, or Firm* — Pillsbury Winthrop Shaw Pittman LLP

(57) ABSTRACT

Membranes for EUV lithography are disclosed. In one arrangement, a membrane has a stack having layers in the following order: a first capping layer including an oxide of a first metal; a base layer including a compound having a second metal and an additional element selected from the group consisting of Si, B, C and N; and a second capping
(Continued)

layer including an oxide of a third metal, wherein the first metal is different from the second metal and the third metal is the same as or different from the first metal.

20 Claims, 15 Drawing Sheets

(51) Int. Cl.
G03F 1/82 (2012.01)
G02B 5/20 (2006.01)
G02B 5/28 (2006.01)

(52) U.S. Cl.
CPC ...... G03F 7/70191 (2013.01); G03F 7/70575 (2013.01); G03F 7/70916 (2013.01); G03F 7/70958 (2013.01); G03F 7/70983 (2013.01)

(56) References Cited

U.S. PATENT DOCUMENTS

| 2015/0212434 A1 | 7/2015 | Lairson et al. |
| 2017/0017150 A1 | 1/2017 | Yakunin et al. |
| 2017/0205704 A1* | 7/2017 | Nikipelov ............ G03F 7/70891 |

FOREIGN PATENT DOCUMENTS

| KR | 20140046218 | 4/2014 |
| KR | 20150121293 | 10/2015 |
| WO | 2008060465 | 5/2008 |
| WO | 2012012177 | 1/2012 |
| WO | 2013152921 | 10/2013 |
| WO | 2013174656 | 11/2013 |
| WO | 2014020003 | 2/2014 |
| WO | 2015082214 | 6/2015 |
| WO | 2015112310 | 7/2015 |
| WO | 2016001351 | 1/2016 |
| WO | 2016079051 | 5/2016 |
| WO | 2017012846 | 1/2017 |
| WO | 2017076686 | 5/2017 |
| WO | 2017102379 | 6/2017 |
| WO | 2017102383 | 6/2017 |

OTHER PUBLICATIONS

Netherlands Office Action issued in corresponding Netherlands Patent Application No. NL2024033, dated Apr. 27, 2020.
Chkhalo N., et al.: "Free-standing spectral purity filters for extreme ultraviolet lithography", Journal of Microlithography, Microfabrication and Microsystems, vol. 11, No. 2, May 31, 2015.
Research Disclosure No. 594072, Sep. 23, 2013.
Search Report issued in corresponding Netherlands Patent Application No. 2020517, dated Sep. 28, 2018.
Goldfarb, Dario L.: "Fabrication of a full size EUV pellicle based on silicon nitride", Proc. of SPIE, vol. 9635, 2015, pp. 96350A-1-96350A-13.
Lee, Sung-Gyu, et al.: "Multistack structure for an extreme-ultraviolet pellicle with out-of-band radiation reduction", Journal of Micro/Nanolithography, MEMS and MOEMS, vol. 14(4), Oct.-Dec. 2015, pp. 043501-1-043501-6.
Pretorius, R., et al.: "Reaction of thin metal films with $SiO_2$ substrates", Solid State Electronics, vol. 21, Issue 4, 1978, 3 pages.
Anonymous: "Mask pellicle frame structure for Extreme Ultraviolet (EUV) Lithography", Research Disclosure, No. 573023, Dec. 6, 2011.
International Search Report and Written Opinion issued in corresponding PCT Patent Application No. PCT/EP2017/058721, dated Sep. 19, 2017.
List, A., et al.: "Oxidation of Sputtered Thin Films of Molybdenum Alloys at Ambient Conditions", 17th Plansee Seminar 2009, vol. 1, pp. 1-9.
Leib, Juergen, et al.: "Low Temperature Glass-Thin-Films for use in Power Applications", IEEE Electronic Components and Technology Conference, 2011, pp. 255-261.
Japanese Office Action issued in corresponding Japanese Patent Application No. 2018-548190, dated Nov. 24, 2020.

* cited by examiner

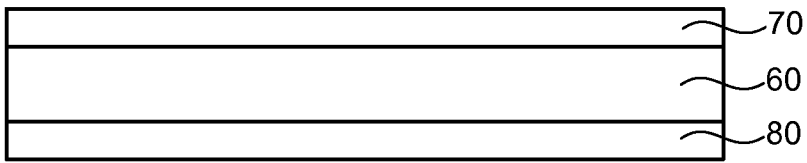
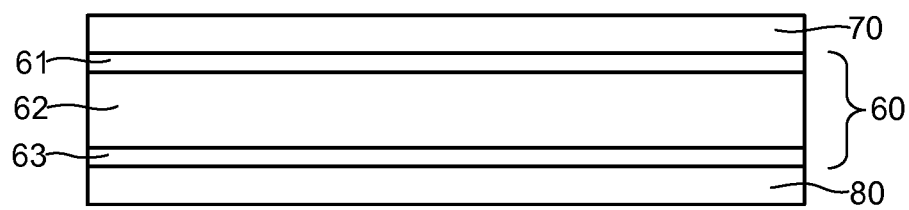
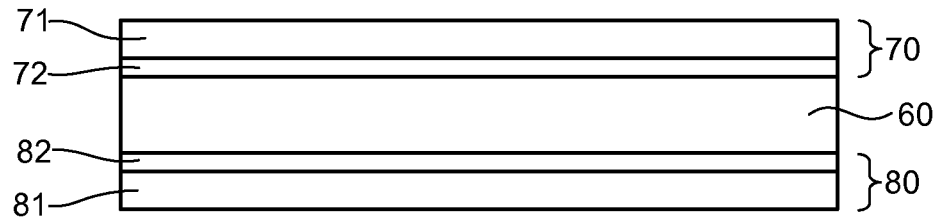
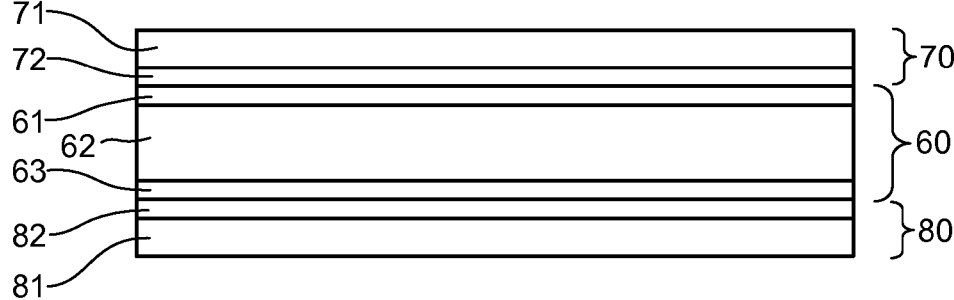

MEMBRANE FOR EUV LITHOGRAPHY

CROSS-REFERENCE TO RELATED APPLICATIONS

This application is the U.S. national phase entry of PCT patent application no. PCT/EP2017/058721, which was filed on Apr. 12, 2017, which claims the benefit of priority of European patent application no. 16166775.3, which was filed on Apr. 25, 2016, and European patent application no 16195123.1, which was filed on Oct. 21, 2016, and European patent application no 16205298.9, which was filed on Dec. 20, 2016, Rwholleach of which is incorporated herein in its entirety by reference.

FIELD

The present invention relates to a membrane, a patterning device assembly and a dynamic gas lock assembly for EUV lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$, is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border.

It is desirable for the membrane to have a combination of high emissivity and a low possibility of failing. It is also desirable for the membrane to have high EUV transmissivity.

SUMMARY OF THE INVENTION

According to an aspect of the invention, there is provided a membrane for EUV lithography, the membrane comprising a stack having layers in the following order: a first capping layer comprising an oxide of a first metal; a base layer comprising a compound comprising a second metal and an additional element selected from the group consisting of Si, B, C and N; and a second capping layer comprising an oxide of a third metal, wherein the first metal is different from the second metal and the third metal is the same as or different from the first metal.

According to an aspect of the invention, there is provided a membrane for EUV lithography, wherein: the membrane comprises a membrane layer comprising a compound comprising a metal and an additional element; and at least part of both outer surfaces of the membrane are formed by the compound, or by an oxide of the additional element, in the membrane layer, wherein:
 the metal is Mo and said additional element is Si;
 the metal is Ru and said additional element is Si;
 the metal is Zr and said additional element is Si;
 the metal is La and said additional element is Si;
 the metal is Sc and said additional element is Si;
 the metal is Y and said additional element is Si;
 the metal is Nb and said additional element is Si;
 the metal is Mo and said additional element is B;
 the metal is Ru and said additional element is B;
 the metal is Zr and said additional element is B;
 the metal is Nb and said additional element is B;
 the metal is Ti and said additional element is B;
 the metal is La and said additional element is B; or
 the metal is Zr and said additional element is C.

According to an aspect of the invention, there is provided a method of manufacturing a membrane for EUV lithography, comprising: providing a base layer; and providing an emissivity layer, the emissivity layer having a higher emissivity in the infrared than the base layer, wherein the emissivity layer is provided on an irregular support surface; and the emissivity layer has a thickness such that the irregularity of the irregular support surface produces a corresponding irregularity in the surface of the emissivity layer that is opposite to the irregular support surface.

According to an aspect of the invention, there is provided a method of manufacturing a membrane for EUV lithography, comprising: using a mask to define a region in a support structure to be etched; and etching the defined region, wherein: the mask has a shape defined by a mask boundary line comprising a plurality of straight sections; and the interior angle between each pair of directly adjacent straight sections is greater than 90 degrees.

According to an aspect of the invention, there is provided a membrane for EUV lithography comprising a freestanding portion, wherein: a shape of the freestanding portion is defined by a freestanding portion boundary line comprising a plurality of substantially straight sections; and the interior angle between each pair of directly adjacent straight sections is greater than 90 degrees.

According to an aspect of the invention, there is provided a membrane for EUV lithography, the membrane comprising: a base layer; and a capping layer, wherein the capping layer comprises an alloy of Mo with at least one other metal.

According to an aspect of the invention, there is provided a membrane for EUV lithography, the membrane comprising: a base layer; and a capping layer, wherein the capping layer comprises a borosilicate glass.

According to an aspect of the invention, there is provided a membrane for EUV lithography, the membrane comprising: a base layer comprising one or more of the following: $YSi_2$, $ZrSi_2$, $LaSi_2$ and $NbSi_2$.

According to an aspect of the invention, there is provided a membrane for EUV lithography using a EUV radiation having wavelength the membrane comprising a stack of layers in the following order: a first protective capping layer; a first emissivity layer having thickness of $\lambda/2$; a first barrier layer having a thickness of $\lambda/4$; a base layer; wherein the first protective capping layer has the index of refraction matched with the index of refraction of the first emissivity layer and with the index of refraction of the first barrier layer; and wherein the thickness of the layers is selected to achieve destructive interference between EUV reflections from interfaces on opposite sides of the membrane.

According to an aspect of the invention, there is provided a cleaning tool for cleaning a membrane for EUV lithography, comprising a chamber comprising an inlet opening and an exhaust opening for providing a laminar gas flow through the chamber, such that the direction of the laminar flow is parallel with an outer surface of the membrane; in the chamber an interface plate arranged to hold the membrane, and a shaking stage coupled to the interface plate and arranged to shake the membrane such that contamination particles are released from the outer surface of the membrane. Alternatively, instead of a shaking stage an acoustic speaker in front of the membrane, arranged to shake the membrane with sound waves.

According to an aspect of the invention, there is provided a method of manufacturing a membrane for EUV lithography, comprising: providing a base layer or a stack comprising a base layer; and forming an amorphous capping layer on the base layer or on the stack.

According to an aspect of the invention, there is provided a membrane for EUV lithography, the membrane comprising: a base layer; and an amorphous capping layer providing an outer surface of the membrane.

According to an aspect of the invention, there is provided a membrane for EUV lithography, the membrane comprising: a base layer; and a capping layer providing an outer surface of the membrane, wherein the capping layer comprises carbon having a proportion of $sp^3$ carbon of at least 20%.

According to an aspect of the invention, there is provided a membrane for EUV lithography, the membrane comprising: a base layer; and a capping layer providing an outer surface of the membrane, wherein the capping layer comprises a transition metal doped with an alkali metal or an alkaline earth metal.

According to an aspect of the invention, there is provided a membrane for EUV lithography, the membrane comprising: a base layer; and a capping layer providing an outer surface of the membrane, wherein the capping layer comprises $M1_xM2_yO_z$, where M1 is an alkali metal or an alkali earth metal, and M2 is a transition metal, optionally a rare-earth metal.

According to an aspect of the invention, there is provided a method of manufacturing a membrane for EUV lithography, comprising: forming at least a base layer on a support structure; and etching the support structure in a selected region underneath the base layer to form a freestanding membrane comprising the base layer, wherein: a difference between the thermal expansion coefficient of the support structure and the base layer is less than a difference between the thermal expansion coefficient of silicon and the base layer.

According to an aspect of the invention, there is provided a membrane for EUV lithography comprising a freestanding portion, wherein: the freestanding portion comprises a base layer and is connected to a non-freestanding portion supported by a support structure, wherein a difference between the thermal expansion coefficient of the support structure and the base layer is less than a difference between the thermal expansion coefficient of silicon and the base layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3-8 schematically depict, in cross-section, membranes according to different embodiments of the invention;

DETAILED DESCRIPTION

Figure 1:
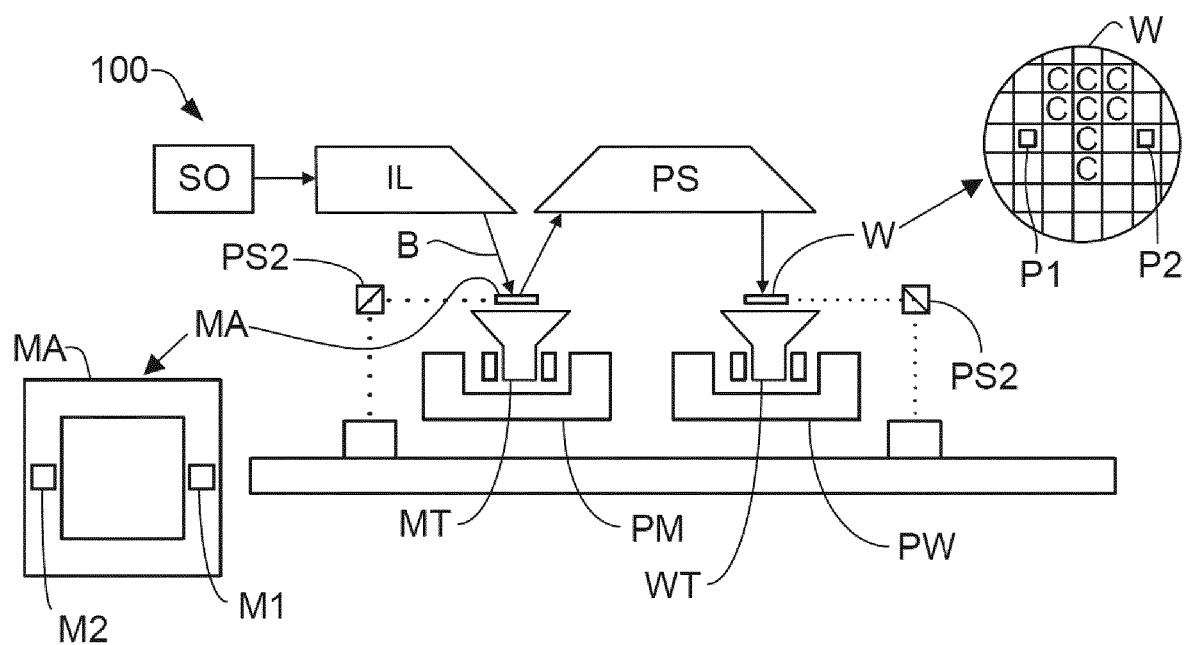
FIG. 1 depicts a lithographic apparatus according to an embodiment of the invention.

FIG. 1 schematically depicts a lithographic apparatus 100 including a source collector module SO according to one embodiment of the invention. The apparatus 100 comprises:
an illumination system (or illuminator) IL configured to condition a radiation beam B (e.g., EUV radiation).
a support structure (e.g., a mask table) MT constructed to support a patterning device (e.g., a mask or a reticle) MA and connected to a first positioner PM configured to accurately position the patterning device;
a substrate table (e.g., a wafer table) WT constructed to hold a substrate (e.g., a resist-coated wafer) W and connected to a second positioner PW configured to accurately position the substrate; and
a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable minor arrays, and programmable liquid-crystal display (LCD) panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

Figure 2:
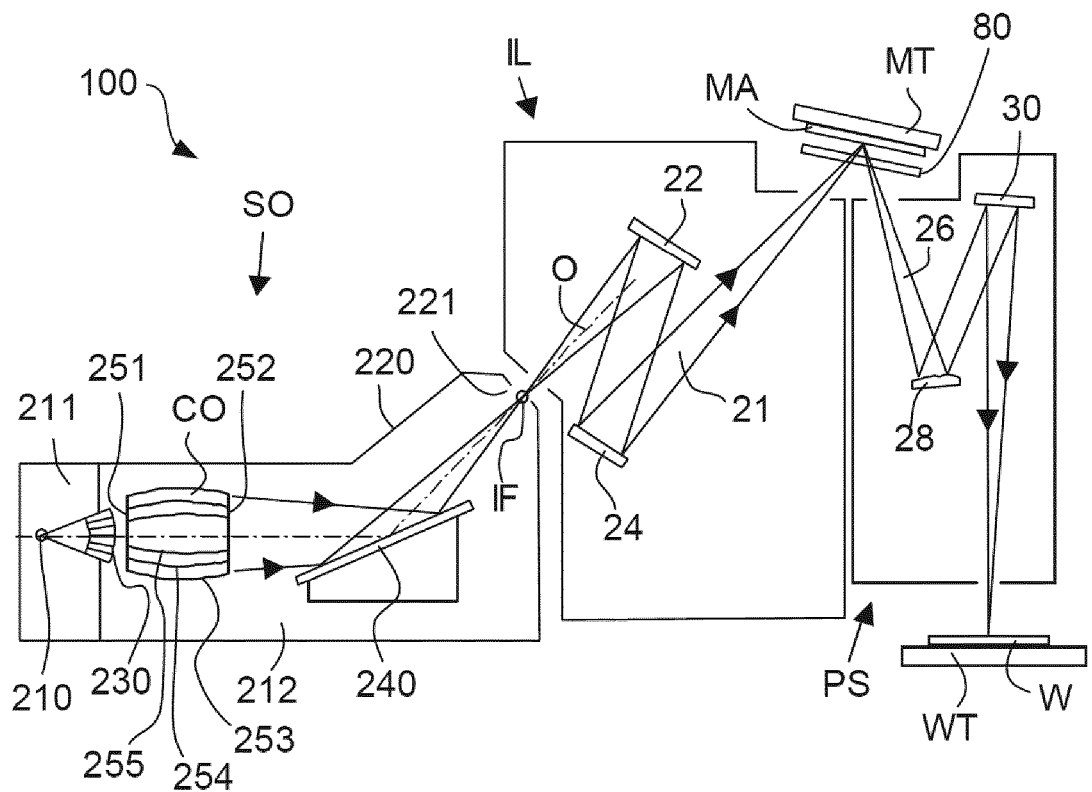
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is a pellicle for the patterning device MA for EUV lithography. The membrane assembly 80 of the present invention can be used for a dynamic gas lock or for a pellicle or for another purpose such as a spectral purity filter. In an embodiment the membrane assembly 80 comprises a membrane 40, which may also be called a membrane stack. In an embodiment the membrane is configured to transmit at least 80% of incident EUV radiation.

In an embodiment the membrane assembly 80 is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

EUV incident on a membrane 40 will apply heating to the membrane 40. The heating will cause the temperature of the membrane 40 to rise. In current EUV sources temperatures of membranes typically reach about 800-900° C. Future EUV sources may have higher power and apply higher heat loads. If the temperature of the membrane 40 rises too much, the performance or lifetime of the membrane 40 may be reduced. The membrane 40 may even fail completely.

The materials used in various layers of membrane 40 may need to fulfill various functional requirements, such as: a) having an emissivity layer to increase heat load resistance; b) having an outer capping layer (OLT) to protect the membrane from the harsh EUV scanner environment and increase its lifetime; c) having a barrier layer to prevent diffusion/intermixing of any of these layers, etc.

It is therefore desirable to design a robust membrane 40 having extremely low EUV reflectivity (e.g. EUVR<0.05%), while fulfilling all other functional requirements and allowing a large process window for sufficient manufacturability yield.

Materials used in some existing membranes have good mechanical properties and EUV transmittance but relatively low emissivity in the infrared. The low emissivity limits the rate at which membranes made from such materials can radiate heat away. If no further layers are added, the membranes would get too hot during use and fail. Capping layers with high emissivity have been added to such membranes to increase emissivity and improve performance. However, such capping layers can undesirably increase EUV reflectance. For example, metals such as Ru, Mo, Zr and Nb have good emissivity but relatively high EUV reflectance. Additionally it has been found that the capping layers can degrade during use. For example, metals such as Ru, Mo, Zr and Nb will oxidize during use if they are not protected. Photo-ionic etching may cause degradation of materials such as SiN and $SiO_2$ which are otherwise relatively stable at high temperatures.

FIG. 3 depicts a membrane 40 found to provide an improved balance of properties. In this embodiment the membrane 40 comprises a stack having layers in the following order: a first capping layer 70, a base layer 60, and a second capping layer 80. The first capping layer 70 comprising an oxide of a first metal. The base layer 60 comprises a compound comprising a second metal and an additional element. The additional element is selected from the group consisting of Si, B, C and N. The second capping layer 80 comprises an oxide of a third metal. The first metal is different from the second metal. The third metal is the same as the first metal or the third metal is different from the first metal. In an embodiment, either or both of the first capping layer 70 and the second capping layer 80 form an outer surface of the membrane 40. In the orientation of the figure, the membrane 40 has an upper outer surface (facing upwards) and a lower outer surface (facing downwards). The first capping layer 70 forms the upper outer surface. The second capping layer 80 forms the lower outer surface.

In an embodiment, the base layer 60 has high emissivity in the infrared. For example, where the emissivity varies between 0 (minimum) and 1 (maximum), the emissivity may be greater than 0.2, optionally greater than 0.3, optionally greater than 0.4. The base layer 60 therefore radiates heat away effectively and prevents the membrane 40 from overheating. The first capping layer 70 and the second capping layer 80 protect the base layer 60 from degradation, for example due to incident EUV radiation and/or oxidative environmental conditions. In an embodiment, the base layer 60 is thicker than each of the first capping layer 70 and the second capping layer 80, optionally at least five times thicker, optionally at least 10 times thicker. In an embodiment, the base layer 60 has a thickness of at least 8 nm, optionally at least 0 nm, optionally at least 15 nm, optionally at least 20 nm, optionally at least 25 nm. In an embodiment, each of the first capping layer 70 and the second capping layer 80 has a thickness of less than 5 nm, optionally less than 4 nm, optionally less than 3 nm, optionally less than 2 nm, optionally less than 1 nm. In an embodiment the membrane comprises a membrane base layer, e.g. a polysilicon layer, with barrier layers (e.g. SiN layers) on which an emissivity layer and a protective capping layer OLT are added. The EUV reflectivity (EUVR) of such membrane can be minimized by using the best matching emissivity and OLT capping layers and making use of destructive interference. For example, if the EUV radiation has a wavelength of 13.5 nm, it is possible to use a "quarter lambda" thickness for the barrier layer: 13.5 nm/4≈3.3 nm, use a "half lambda" thickness for the emissive layer: 13.5 nm/2≈6.7 nm and match the index of refraction of the emissivity layer and OLT capping layer to that of a barrier layer, e.g. for the barrier layer n_SiN=0.97; for the OLT cap layer n_OLT≈0.97 and for the emissivity layer n_em=n_SiN²≈0.94.

Table 1 herein shows a selection of optimal parameters and materials together with their function in a membrane 40 having a symmetrical sandwich configuration around the membrane core layer (which is the base layer). $SiO_2$ in the table below is a thin native oxide layer formed naturally on the top of the polysilicon core layer, in contact with the SiN barrier layer. The thickness values are given in nm.

TABLE 1

| Function | Refractive index | Material | Thickness |
|---|---|---|---|
| OLT cap | 0.972 | B | 3.0 ± 0.5 |
| Emission | 0.923 | Mo | 6.0 ± 1.0 |
| Barrier | 0.975 | SiN (+$SiO_2$) | 3.5 ± 0.5 |
| Core | 0.999 | Si | 37.5 ± 2.0 |
| Barrier | 0.975 | SiN (+$SiO_2$) | 3.5 ± 0.5 |
| OLT cap | 0.972 | B | 3.0 ± 0.5 |
| | | EUVT | 84.4% |
| | | EUVR | <0.05% |

Such membrane design can maximise the process window for the capping layers and membrane base layer materials. This specific design allows a very large process window for the Si base layer and SiN barrier layer.

Although a specific EUV wavelength (13.5 nm) and membrane materials are mentioned above to exemplify the best matching of a polysilicon membrane base layer with any further functional layers, it is meant that any combination of materials and layers which fulfill the above criteria for a given EUV wavelength are included herein.

In an embodiment, the thickness of the base layer 60 is selected to achieve destructive interference between EUV reflections from the first capping layer 70 and the second capping layer 80. Destructive interference desirably reduces the overall reflectance of the membrane 40. In an embodiment, the thickness of the base layer 60 is 9 nm+/−2 nm, preferably +/−1 nm, which has been found to cause the separation between the first capping layer 70 and the second capping layer 80 to be such as to cause destructive interference. In an embodiment, the thickness of the base layer 60 is 16 nm+/−2 nm, preferably +/−1 nm, which has been found to cause the separation between the first capping layer 70 and the second capping layer 80 to be such as to cause destructive interference. These embodiments which enhance destructive interference between EUV reflections from the first capping layer 70 and the second capping layer 80 have been found to be particularly effective in the case where either or both of the first metal and the third metal comprises Zr.

In an embodiment, either or both of the oxide of the first metal and the oxide of the third metal is an oxygen conductive oxide. An oxygen conductive oxide is an oxide which allows transport of oxygen through the lattice of the oxide. Oxygen conductive oxides are well suited to the first capping layer and the second capping layer because oxygen conductive oxides are particularly stable in oxidative environments. Oxygen conductive oxides are known to have excellent robustness and are used in catalysis at high temperatures. Oxygen conductive oxides maintain their properties well in environments in which the oxygen content varies because they can act as a buffer with respect to oxygen. Oxygen conductive oxides are able to take up and release oxygen in response to changes in the oxygen content of the environment. EUV radiation will often increase the number of vacancies and other defects in protective layers. There are oxygen conductive oxides, for example $ZrO_2$, which re stable even at high levels of lattice oxygen deficiency.

In an embodiment, either or both of the first metal and the third metal is selected from the group consisting of Nb, Zr, Ce, Ti, La, Y and Al, forming respectively, for example, $NbO_2$, $ZrO_2$, $CeO_2$, $TiO_2$, $La_2O_3$, $Y_2O_3$. Optionally, either or both of the first metal and the third metal is selected from the group consisting of Zr and Y. Oxide of Zr has been found to be particularly effective. Oxide of Y has also been found to be particularly effective. Any of the oxides may be doped. For example, where an oxide of Zr is used, the oxide may be doped with yttria ($Y_2O_3$) to form yttria-stabilized zirconia. Any mixtures of different oxides may be used.

In an embodiment, in the base layer the compound comprising the second metal and the additional element consists of the second metal and the additional element (i.e. there are no other elements in the compound, except, optionally, dopants).

In an embodiment, in the compound of the base layer 60, the second metal is Mo and said additional element is Si, for example as $MoSi_2$ and/or any other stable stoichiometry. In an embodiment the compound consists of Mo and Si.

In an embodiment, in the compound of the base layer 60, the second metal is Ru and said additional element is Si, for example as $RuSi_2$ and/or $RuSi$ and/or any other stable stoichiometry. In an embodiment the compound consists of Ru and Si.

In an embodiment, in the compound of the base layer 60, the second metal is Zr and said additional element is Si, for example as $ZrSi_2$ and/or any other stable stoichiometry. In an embodiment the compound consists of Zr and Si.

In an embodiment, in the compound of the base layer 60, the second metal is La and said additional element is Si, for example as $LaSi_2$ and/or any other stable stoichiometry. In an embodiment the compound consists of La and Si.

In an embodiment, in the compound of the base layer 60, the second metal is Sc and said additional element is Si, for example as $ScSi_2$ and/or any other stable stoichiometry. In an embodiment the compound consists of Sc and Si.

In an embodiment, in the compound of the base layer 60, the second metal is Y and said additional element is Si, for example as $YSi_2$ and/or any other stable stoichiometry. In an embodiment the compound consists of Y and Si.

In an embodiment, in the compound of the base layer 60, the second metal is Nb and said additional element is Si, for example as $NbSi_2$ and/or any other stable stoichiometry. In an embodiment the compound consists of Nb and Si.

In an embodiment, in the compound of the base layer 60, the second metal is Mo and said additional element is B, for example as $MoB_2$ and/or any other stable stoichiometry. In an embodiment the compound consists of Mo and B.

In an embodiment, in the compound of the base layer 60, the second metal is Ru and said additional element is B, for example as $RuB_2$ and/or any other stable stoichiometry. In an embodiment the compound consists of Ru and B.

In an embodiment, in the compound of the base layer 60, the second metal is Zr and said additional element is B, for example as $ZrB_2$ and/or any other stable stoichiometry. In an embodiment the compound consists of Zr and B.

In an embodiment, in the compound of the base layer 60, the second metal is Nb and said additional element is B, for example as $NbB_2$ and/or any other stable stoichiometry. In an embodiment the compound consists of Nb and B.

In an embodiment, in the compound of the base layer 60, the second metal is Ti and said additional element is B, for example as $TiB_2$ and/or any other stable stoichiometry. In an embodiment the compound consists of Ti and B.

In an embodiment, in the compound of the base layer 60, the second metal is La and said additional element is B, for example as $LaB_6$ and/or any other stable stoichiometry. In an embodiment the compound consists of La and B.

In an embodiment, in the compound of the base layer 60, the second metal is Zr and said additional element is C, for example as $ZrC$ and/or any other stable stoichiometry. In an embodiment the compound consists of Zr and C.

The inventors have found the following combination to be particularly effective: the first metal is Zr, the second metal is Mo and the additional element is Si, and the third metal is Zr.

The oxide of the first metal and the oxide of the third metal are not limited to single-metal oxides. In an embodiment, the oxide of the first metal is a mixed metal oxide comprising the first metal and one or more further metals. In an embodiment, the oxide of the third metal is a mixed metal oxide comprising the third metal and one or more further metals. In an embodiment, the oxide of the first metal is a mixed metal oxide comprising the first metal and one or more further metals and the oxide of the third metal is a mixed metal oxide comprising the third metal and one or more further metals.

In embodiments of type shown in FIG. 3 at least a portion of the compound comprising the second metal and the additional element in the base layer 60 is in contact with either or both of the oxide of the first metal in the first capping layer 70 and the oxide of the third metal in the second capping layer 80. This arrangement is relatively easy to manufacture. The arrangement may be used where the oxide of the first metal in the first capping layer 70 and the oxide of the third metal in the second capping layer 80 provide adequate protection of the base layer 60 in the conditions in which the membrane 40 is used. FIGS. 4-6 show embodiments in which more complex structures are provided.

FIG. 4 depicts an embodiment in which the base layer 60 comprises plural base layer sub-layers 61-63. At least one of the base layer sub-layers 61-63 comprises the compound comprising the second metal and the additional element. In the example shown the base layer 60 comprises a base layer first sub-layer 61, a base layer second sub-layer 62 and a base layer third sub-layer 63. The base layer second sub-layer 62 is disposed between the base layer first sub-layer 61 and the base layer third sub-layer 63. The base layer second sub-layer 62 comprises the compound comprising the second metal and the additional element. The base layer first sub-layer 61 comprises an oxide of the additional element. The base layer third sub-layer 63 comprises an oxide of the additional element.

In an embodiment, as shown in FIG. 4, at least a portion of the base layer first sub-layer 61 is in contact with the oxide of the first metal in the first capping layer 70. In an embodiment, as shown in FIG. 4, at least a portion of the base layer third sub-layer 63 is in contact with the oxide of the third metal in the second capping layer 80.

In an embodiment the base layer first sub-layer 61 and the base layer third sub-layer 63 protect the base layer second sub-layer 62 from damage during use. The base layer first sub-layer 61 and the base layer third sub-layer 63 may act as anti-oxidation diffusion barrier layers for example. In the case where the additional element is Si, either or both of the base layer first sub-layer 61 and the base layer third sub-layer 63 may comprise silica ($SiO_2$). The base layer first sub-layer 61 and the base layer third sub-layer 63 may be referred to as scales. These scales may form naturally on the base layer second sub-layer 62 (i.e. by being thermodynamically favoured in an oxidative environment). In this case the scales may be referred to as native scales or native oxides.

The first capping layer 70 and the second capping layer 80 protect the base layer first sub-layer 61 and the base layer third sub-layer 63, for example preventing, or reducing the rate of, etching of these sub-layers by EUV photons.

In the case where the second metal is Mo or Ru and the additional element is Si, it is particularly thermodynamically favorable for a scale of silica to form. The scale thus formed is dense and stable at high temperatures.

The ability of a silicide to form a protective silica scale upon oxidation can be judged based on the heats of the following two reactions:

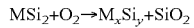

$$MSi_2 + O_2 \rightarrow M_xSi_y + SiO_2 \quad \text{Reaction 1:}$$

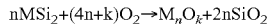

$$nMSi_2 + (4n+k)O_2 \rightarrow M_nO_k + 2nSiO_2 \quad \text{Reaction 2:}$$

Reaction 1 produces silica scale and a silicide. Reaction 2 produces a mix of two oxides: metal oxide and silica. The latter situation is undesired because in this case no protective scale is formed. Thermodynamic probabilities of the two reactions can be evaluated by using heats of the two reactions calculated with formulas similar to the one given below:

$$\Delta H_r^{298} = \frac{\Delta H_f^{298}(M_xSi_y) \cdot (x+y) + \Delta H_f^{298}(SiO_2) \cdot 3 - \Delta H_f^{298}(MSi_2) \cdot 3 - 0 \cdot 3}{2}$$

The enthalpy of Reaction 1 at 298K is calculated and normalized per number of oxygen atoms. By comparing enthalpies of Reaction 1 and Reaction 2 it is possible to judge which reaction is more thermodynamically favorable. The temperature dependence of the enthalpies is not considered. This simplification has been shown to be reasonable by Nicolet et al. Solid State Electronics, 1978, 21, 667-675.

The comparison of the enthalpies of Reactions 1 and Reactions 2 for different silicides is given in table 2 below:

TABLE 2

| $MSi_2$ | $\Delta H_f^{298}/$ kcal/mol at 298 K | $\Delta H_r^{298}(1)/$ kcal/mol | $\Delta H_r^{298}(2)/$ kcal/mol | Silicide product | Oxide product |
|---|---|---|---|---|---|
| $RuSi_2$ | −10.4 | −102.8 | −75.6 | RuSi | $RuO_2$ |
| $RuSi_2$ | −10.4 | −102.8 | −57.2 | RuSi | $RuO_4$ |

TABLE 2-continued

| $MSi_2$ | $\Delta H_f^{298}/$ kcal/mol at 298 K | $\Delta H_r^{298}(1)/$ kcal/mol | $\Delta H_r^{298}(2)/$ kcal/mol | Silicide product | Oxide product |
|---|---|---|---|---|---|
| $LaSi_2$ | −6.2 | −114 | −114 | LaSi | $La_2O_3$ |
| $LaSi_2$ | −6.2 | −114 | −88.5 | LaSi | LaO(g) |
| $MoSi_2$ | −9.3 | −101.8 | −83.4 | $Mo_3Si$ | $MoO_3$ |
| $MoSi_2$ | −9.3 | −102.7 | −83.4 | $Mo_5Si_3$ | $MoO_3$ |
| $MoSi_2$ | −9.3 | −101.8 | −98 | $Mo_3Si$ | $MoO_2$ |
| $ZrSi_2$ | −12.7 | −107.3 | −108.6 | ZrSi | $ZrO_2$ |
| $ZrSi_2$ | −12.7 | −101.7 | −108.6 | $Zr_2Si$ | $ZrO_2$ |
| $TiSi_2$ | −10.7 | −107.3 | −103.1 | TiSi | $TiO_2$ |
| $TiSi_2$ | −10.7 | −107.3 | −106.9 | TiSi | TiO |
| $NbSi_2$ | −7.3 | −104.5 | −98.6 | $Nb_5Si_3$ | $Nb_2O_5$ |
| $NbSi_2$ | −7.3 | −104.5 | −105.1 | $Nb_5Si_3$ | NbO |
| $NbSi_2$ | −7.3 | −104.5 | −100.1 | $Nb_5Si_3$ | $NbO_2$ |
| $YSi_2$ | — | — | — | — | $Y_2O_3$ |

When $\Delta H_r^{298}$ of Reaction 2 is less negative than $\Delta H_r^{298}$ of Reaction 1 the protective silica scale formation is thermodynamically favored. The table shows that the silicides for which the silica scale forms most favorably are $RuSi_2$ and $MoSi_2$. Moreover, the inventors have found by analyzing the kinetics of oxidation that $MoSi_2$ has the highest activation energy and is thus the most difficult to oxidize (favoring formation of a stable protective layer rather than oxidation of the $MoSi_2$ itself).

FIG. 5 depicts an embodiment in which the first capping layer 70 comprises a first capping layer first sub-layer 71 and a first capping layer second sub-layer 72. The first capping layer first sub-layer 71 comprises the oxide of the first metal. The first capping layer second sub-layer 72 comprises a first capping layer deposited oxide. The first capping layer second sub-layer 72 is positioned between the first capping layer first sub-layer 71 and the base layer 60. The first capping layer deposited oxide may be deposited on the base layer 60 to provide protection similar to that which would be provided by a native oxide such as silica formed on the compound comprising the second metal and the additional element in the base layer 60 (as in the base layer first sub-layer 61 and the base layer third sub-layer 63 in the embodiment discussed above with reference to FIG. 4). The first capping layer deposited oxide may be provided in the case where a native oxide does not form easily or stably (e.g. at high temperature) on the compound comprising the second metal and the additional element. In an embodiment, a native oxide may have a low melting point, for example, which could cause instabilities or failure in use. In such a case, the native oxide may be removed before depositing the first capping layer deposited oxide. In an embodiment, the first capping layer deposited oxide comprises an oxide of silicon (e.g. silica).

In an embodiment the second capping layer 80 is configured in a corresponding manner. In such an embodiment the second capping layer 80 comprises a second capping layer first sub-layer 81 and a second capping layer second sub-layer 82. The second capping layer first sub-layer 81 comprises the oxide of the third metal. The second capping layer second sub-layer 82 comprises a second capping layer deposited oxide. The second capping layer second sub-layer 82 is positioned between the second capping layer first sub-layer 81 and the base layer 60. In an embodiment, the second capping layer deposited oxide comprises an oxide of silicon (e.g. silica).

FIG. 6 depicts a membrane 40 corresponding to a combination of the embodiments of FIGS. 4 and 5. In this membrane 40, the base layer 60 comprises a base layer first sub-layer 61, a base layer second sub-layer 62, and a base layer third sub-layer 63, as described above with reference to FIG. 4. Additionally, the membrane 40 comprises a first capping layer 70 with a first capping layer first sub-layer 71 and a first capping layer second sub-layer 72 as described above with reference to FIG. 5. Additionally, the membrane 40 comprises a second capping layer 80 with a second capping layer first sub-layer 81 and a second capping layer second sub-layer 82 as described above with reference to FIG. 5. The additional layers relative to the embodiments of FIGS. 4 and 5 may increase the robustness of the membrane 40 by providing improved protection of the portion of the base layer 60 comprising the compound comprising the second metal and the additional element (the emissive part of the base layer 60 in the base layer second sub-layer 62).

In FIGS. 3-6 embodiments are shown which have a first capping layer 70 and a second capping layer 80. However, these layers are not essential. In other embodiments, as shown for example in FIGS. 7 and 8, the first capping layer 70 and second capping layer 80 may be omitted. Membranes 40 of this type may be manufactured more easily. It has been found that such membranes 40 can operate effectively, at least for limited EUV power.

Figure 7:
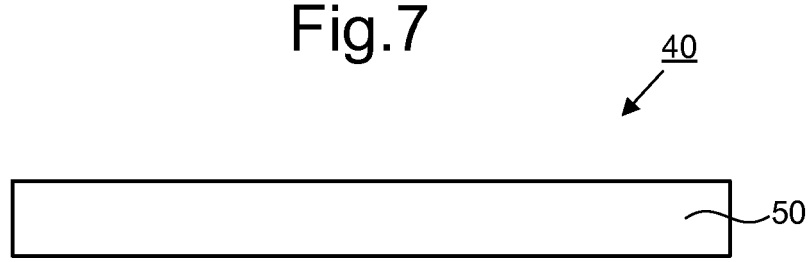

FIG. 7 depicts a membrane 40 comprising a membrane layer 50. The membrane layer 50 comprises a compound comprising a metal and an additional element. In the embodiment of FIG. 7 at least part of both outer surfaces of the membrane 40 are formed by the compound in the membrane layer 50. The compound in the membrane layer 50 may have any of the compositions described above for the compound comprising the second metal and the additional element in the embodiments of FIGS. 3-6. The thickness of the membrane layer 50 may be any of the thicknesses described above for the base layer 60 in the embodiments of FIGS. 3-6.

Figure 8:
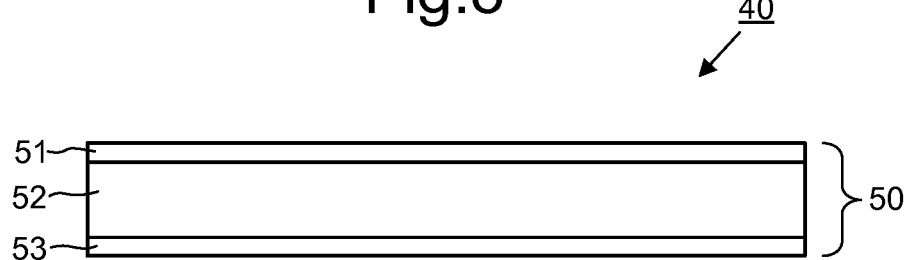

FIG. 8 depicts a membrane 40 comprising a membrane layer 50. The membrane layer 50 comprises a compound comprising a metal and an additional element. In the embodiment of FIG. 8 at least part of both outer surfaces of the membrane 40 are formed by an oxide of the additional element in the compound in the membrane layer 50. The compound in the membrane layer 50 may have any of the compositions described above for the compound comprising the second metal and the additional element in the embodiments of FIGS. 3-6. The membrane 50 comprises a membrane layer first sub-layer 51, a membrane layer second sub-layer 52, and a membrane layer third sub-layer 53. The membrane layer first sub-layer 51 may have any of the compositions described above for the base layer first sub-layer 61 in the embodiments of FIGS. 4 and 6. The membrane layer second sub-layer 52 may have any of the compositions described above for the base layer second sub-layer 62 in the embodiments of FIGS. 4 and 6. The membrane layer third sub-layer 53 may have any of the compositions described above for the base layer third sub-layer 63 in the embodiments of FIGS. 4 and 6. The membrane layer first sub-layer 51 and the membrane layer third sub-layer 53 thereby protect the membrane layer second sub-layer 52 from damage during use. The thickness of the membrane layer 50 (including all of the membrane layer sub-layers 51-53) may be any of the thicknesses described above for the base layer 60 in the embodiments of FIGS. 3-6.

Optionally, one or more further layers could be provided to further protect the membrane 40. For example, a thin layer of $Al_2O_3$ (e.g. 1 nm or less) could be provided above and below the base layer 60 (with or without any intervening layers).

It has been found that membranes 40 of the type shown in FIGS. 7 and 8 are particularly effective where the metal is Mo or Ru and the additional element is Si, due to the thermodynamically favored formation of a protective silica scale (forming the membrane layer first sub-layer 51 and the membrane layer third sub-layer 53 in the arrangement of FIG. 8).

In all of the above-described embodiments, it has been found that the membrane 40 performs particularly well when the layer providing the high emissivity (the base layer 60 or the membrane layer 50) comprises a compound comprising Mo and Si or Ru and Si, particularly a compound consisting of Mo and Si or Ru and Si. The formation of the protective silica scale ensures a high degree of robustness against damage due to oxidation or photonic etching. It has additionally been found that the thermo-mechanical properties of these compounds are particularly well adapted for use in EUV. The thermo-mechanical properties of $MoSi_2$ are discussed below in detail. Similar considerations are expected to apply for $RuSi_2$.

Mechanically, $MoSi_2$ (and, it is expected, $RuSi_2$) resembles SiN. However, $MoSi_2$ can be made thicker than SiN. A membrane 40 based on $MoSi_2$ can thereby be made stronger than a corresponding membrane based on SiN, while still having high EUV transparency at 13.5 nm. Furthermore, $MoSi_2$ and $RuSi_2$ have inherently high emissivity and would not need additional metallic capping layers (which, as discussed above, tend to increase EUV reflection). EUV reflection from $MoSi_2$ has been found to be less than 0.1%.

Figure 9:
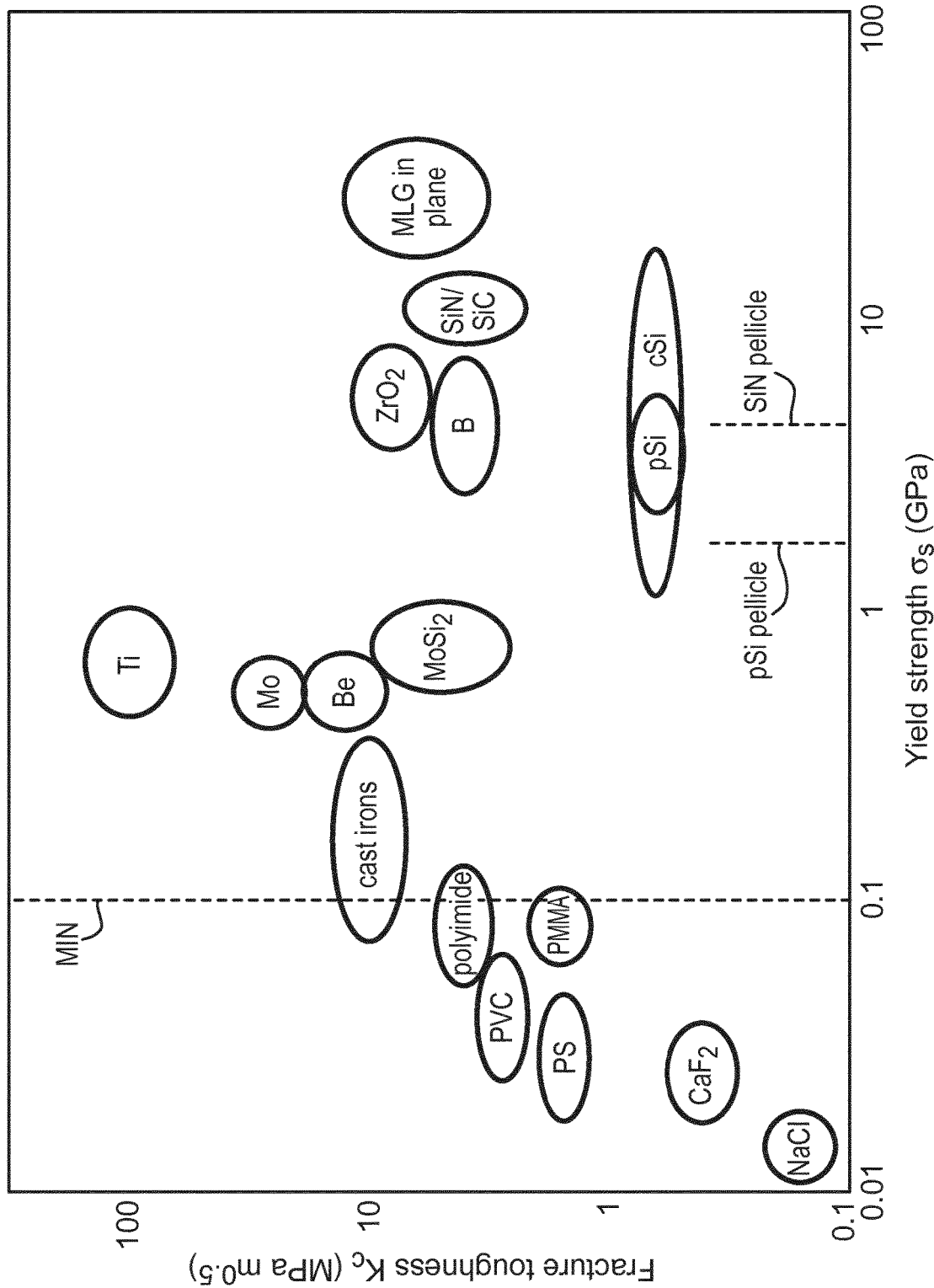
FIG. 9 is a graph comparing fracture toughnesses and yield strengths of various materials.

FIG. 9 shows (as ellipses) approximate yield strengths and fracture toughnesses of various materials. The ellipse representing $MoSi_2$ is located near the center of the graph. The ellipse is drawn using figures for bulk $MoSi_2$. For thin films the figures will be more favorable. A membrane 40 for use in EUV, for example as a pellicle, needs to have a yield strength of at least 0.1 GPa (i.e. to the right of the broken line marked MIN). The yield strengths of pSi pellicles and SiN pellicles are marked with broken lines in the lower part of the figure. $MoSi_2$ has a yield strength comfortably above the required minimum. Furthermore, $MoSi_2$ has a relatively high fracture toughness (compared for example to the fracture toughness of pSi). High fracture toughness means the $MoSi_2$ can be made thinner, improving EUV transmittance.

Furthermore, the ductile to brittle transmission temperature (DBTT) is above 1000° C. for $MoSi_2$. This is higher than the maximum temperature $T_{MAX}$ (marked in FIG. 10 below) which the membrane 40 is likely to reach during normal use. A membrane 40 based on $MoSi_2$ is therefore less likely to undergo significant creep, and corresponding loss of tension, than materials having a DBTT lower than $T_{MAX}$ (e.g. pSi, as shown by broken line labeled pSi DBTT in FIG. 10) such that the material may be thermally cycled through the DBTT in use.

Figure 10:
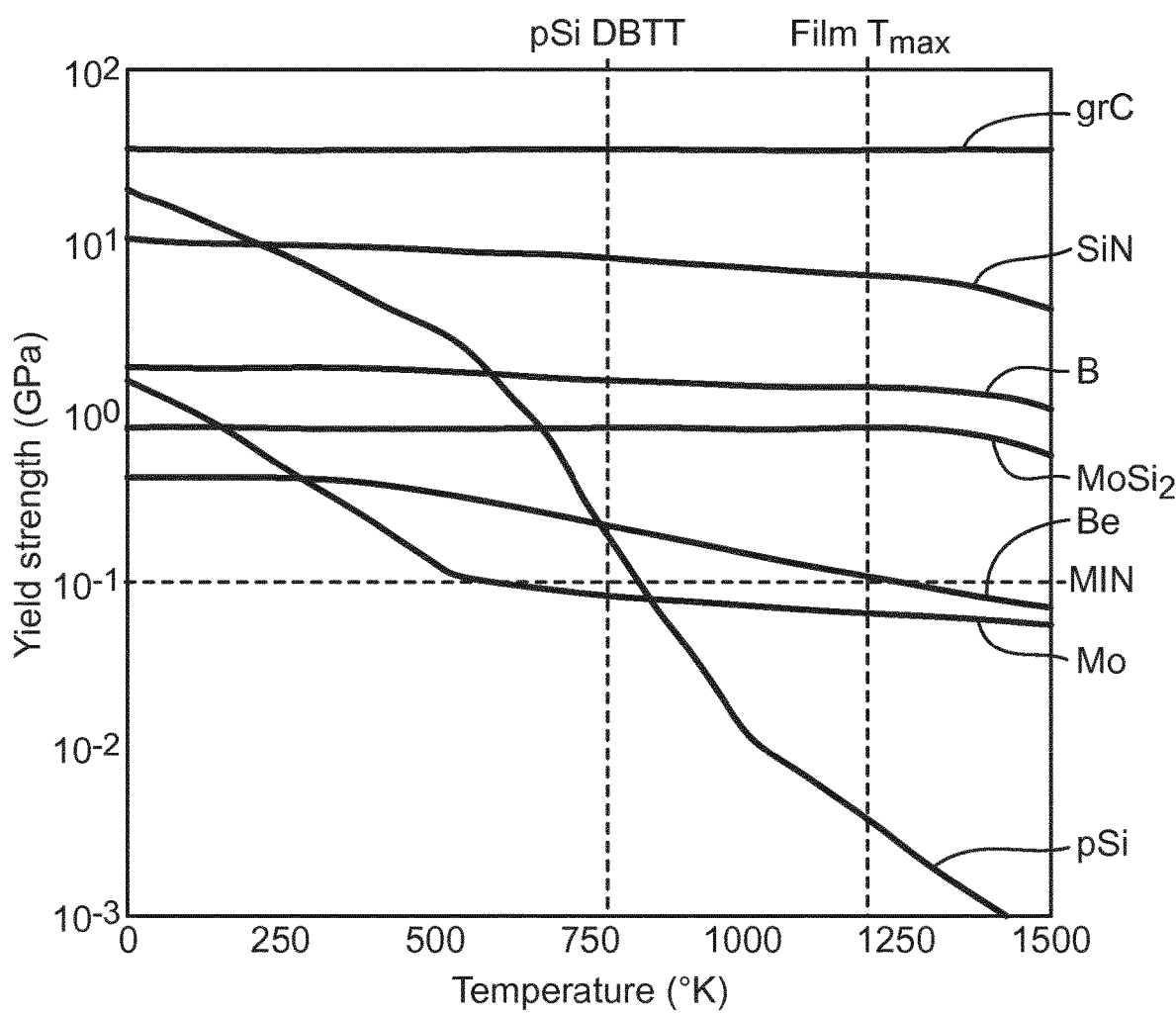
FIG. 10 is a graph showing the temperature dependencies of yield strength for various materials.

The temperature dependence of the yield strength is shown in FIG. 10. In contrast to pSi and pure Mo, for example, the yield strength of $MoSi_2$ remains stable, and above the minimum of 0.1 GPa up to 1500° K.

Figure 11:
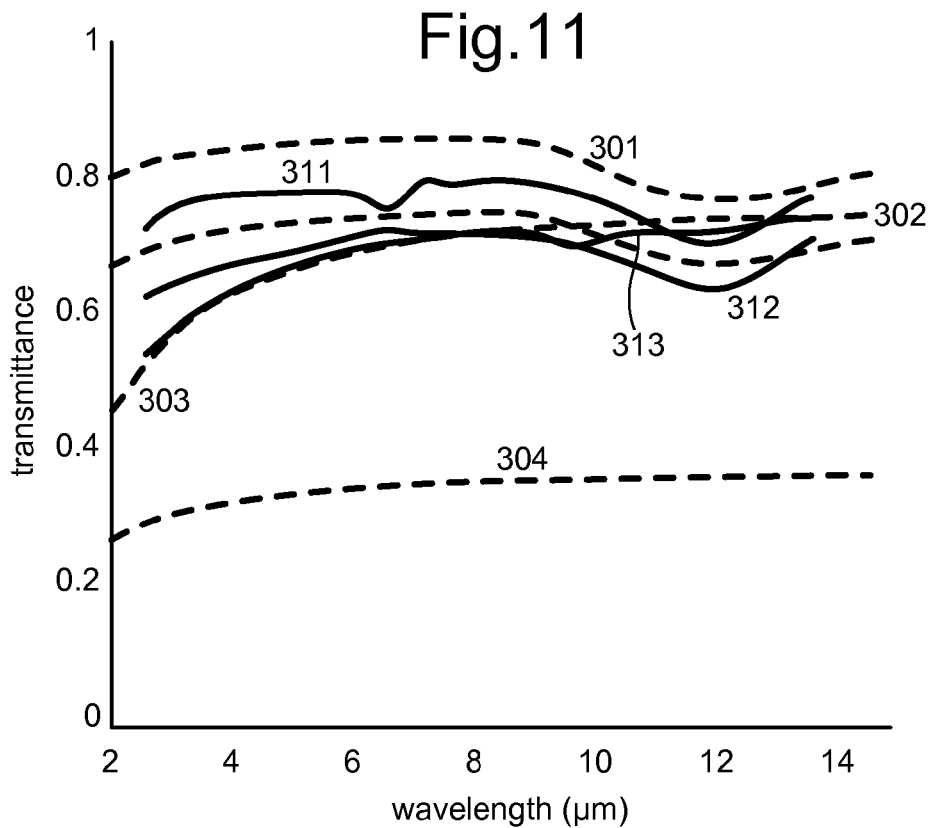
FIGS. 11-13 are graphs respectively showing the transmittance, reflectance and absorbance as a function of wavelength of different thicknesses of $MoSi_2$ according to theory and experiment.
Figure 12:
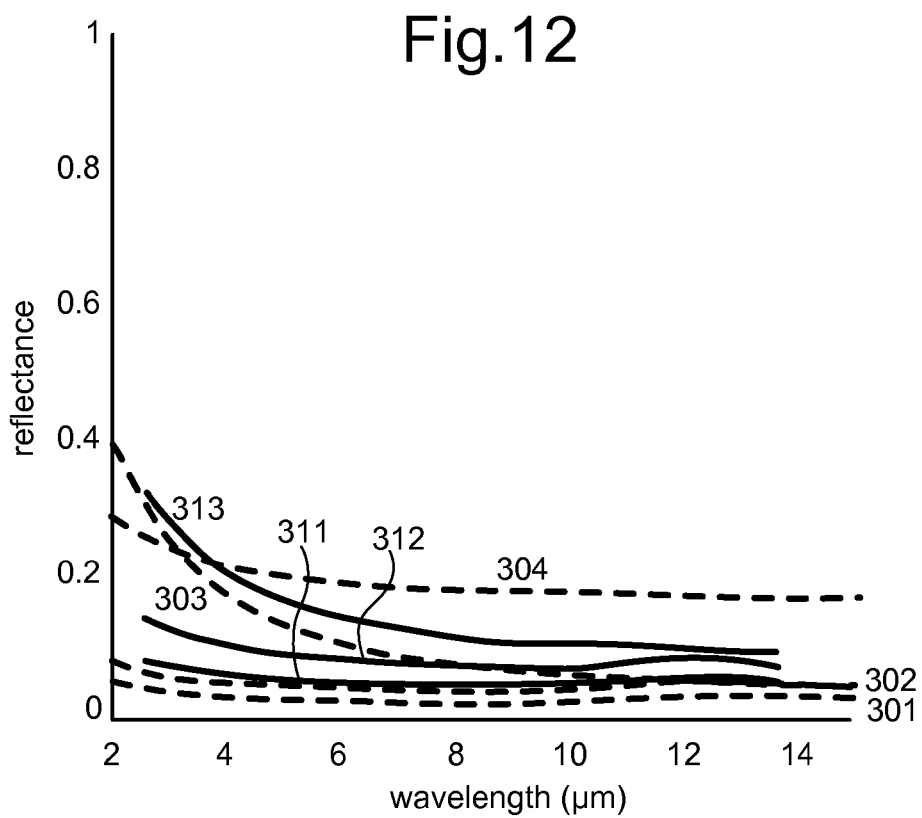
Figure 13:
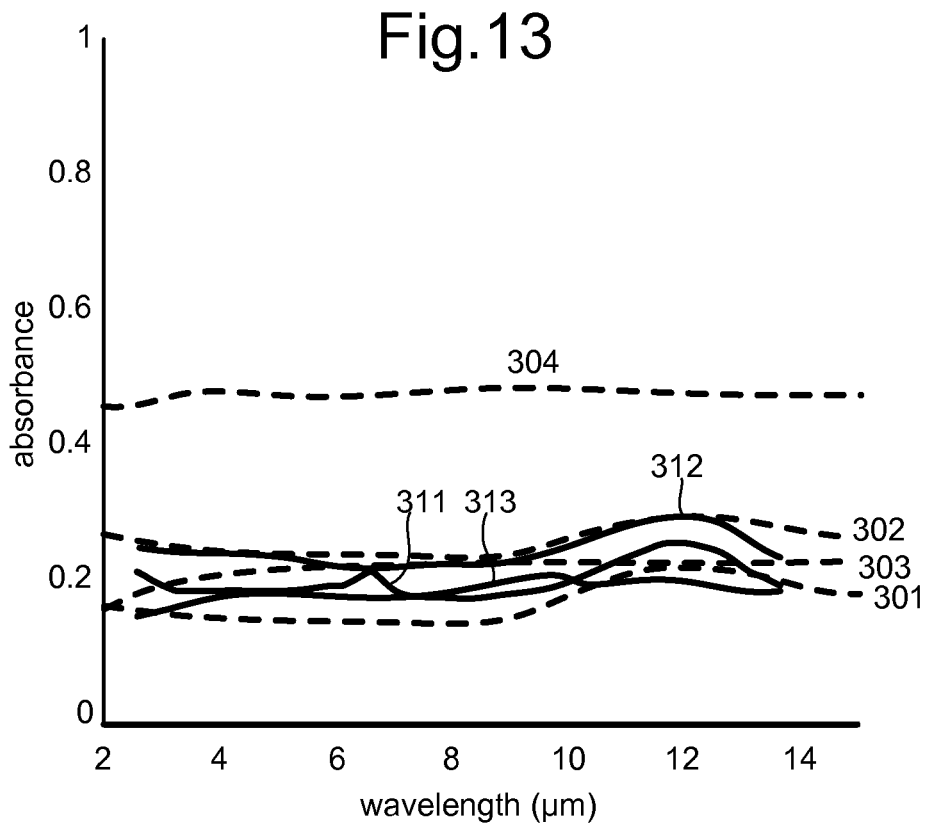

FIGS. 11-13 show the results of experimental and theoretical work studying the absorbance (corresponding to emissivity) of MoSi of different thicknesses over a range of wavelengths relevant for radiating away heat during use. The absorbance (emissivity) can be derived from the transmittance and reflectance, which can be measured experimentally or estimated theoretically. FIG. 11 shows a variation of transmittance over the range of wavelengths. FIG. 12 shows a variation of reflectance over the range of wavelengths. FIG. 13 shows a variation of absorbance (emissivity) over the range of wavelengths. In each graph, four theoretically determined curves are provided, labeled 301, 302, 303 and 304 and shown as broken lines. Additionally, three experimentally determined curves are provided, labeled 311, 312 and 313 and shown as solid lines. Curve 301 in each figure shows theoretical results for a 3.5 nm layer of $MoSi_2$ on one side of a 25 nm thick layer of SiN (which does not contribute significantly to emissivity). Curve 302 in each figure shows theoretical results for a 3.5 nm layer of $MoSi_2$ on both sides of a 25 nm thick layer of SiN. Curve 303 in each figure shows theoretical results for a 3.5 nm layer of $MoSi_2$ on both sides of a 50 nm thick layer of pSi (which does not contribute significantly to emissivity). Curve 304 in each figure shows theoretical results for a 31 nm thick layer of $MoSi_2$ by itself. Curve 311 in each figure shows experimental results for a 3.5 nm thick layer of $MoSi_2$ on SiN. Curve 312 in each figure shows experimental results for a 3.5 nm thick layer on both sides of a SiN layer. Curve 313 in each figure shows experimental results for a 3.5 nm thick layer of MoSi2 on both sides of a pSi layer.

FIGS. 11-13 show that even for thin layers of $MoSi_2$, the absorbance (emissivity) of about 0.2 and higher can be achieved. For thicker layers of $MoSi_2$ an absorbance higher than 0.4 can be achieved. It is expected that absorbance (emissivity) above 0.4 should be achieved in membranes 40 comprising a layer of $MoSi_2$ that is in the range of 10-50 nm. The high observed emissivity that is achieved even for very thin layers of $MoSi_2$ suggests that the emissivity of the membrane 40 may remain relatively high even if the $MoSi_2$ is degraded during use and becomes thin. Heat load may therefore remain under control for a considerable period of time. Failure of the membrane 40 may therefore be delayed.

Figure 14:
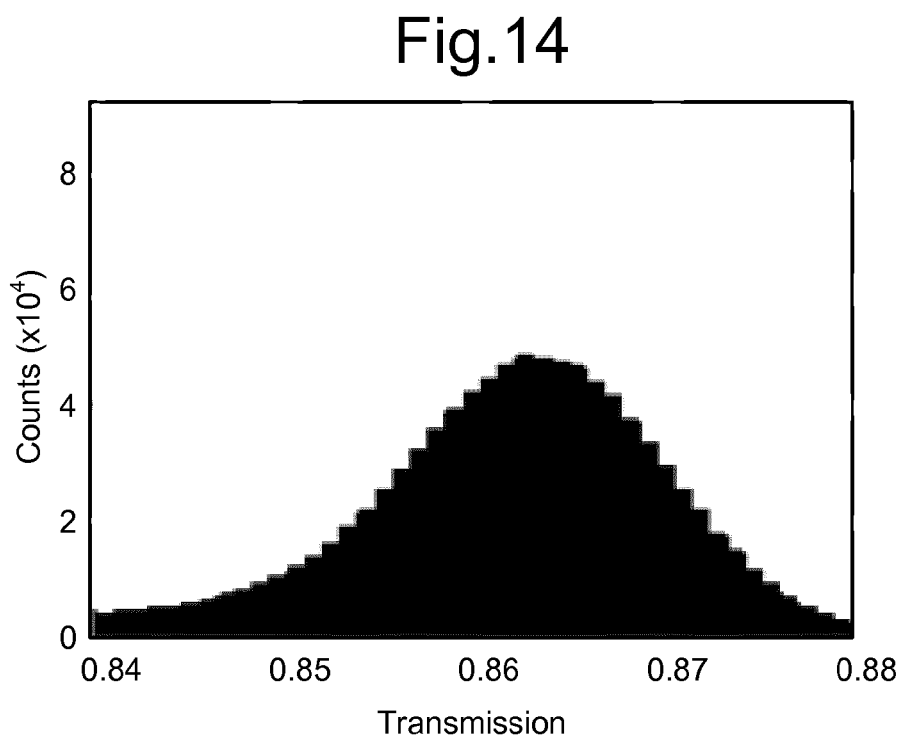
FIG. 14 shows a distribution of EUV transmission through a $MoSi_2$ membrane of 1.5 cm diameter.

Example $MoSi_2$ membranes 40 have been manufactured having 1.5 cm diameter and a thickness of 20 nm. FIG. 14 shows how the transmission of an example membrane 40 was found to vary over the surface of the membrane 40. The transmission varies between 84% and 88% with a most common transmission (the peak in the graph) at about 86.5%. It is expected that process improvements, for example to increase density, lower oxidation, or both, could improve transmission further. The membranes 40 were able to withstand EUV powers corresponding to more than 2 Watts/cm$^2$ absorbed. The EUV reflectance was lower than the reflectance of Ru, Mo and Zr. The EUV reflectance was also lower than the target reference of 0.05%.

As discussed above with reference to FIGS. 3-8, $MoSi_2$ forms a protective silica scale. Experiments suggest that this silica scale was stable at an EUV power corresponding to 0.65 W/cm$^2$ absorbed, but that the silica scale began to be etched by EUV photons at an EUV power corresponding to 1.8 W/cm$^2$. Results from these experiments are described below with reference to FIGS. 15 and 16.

Figure 15:
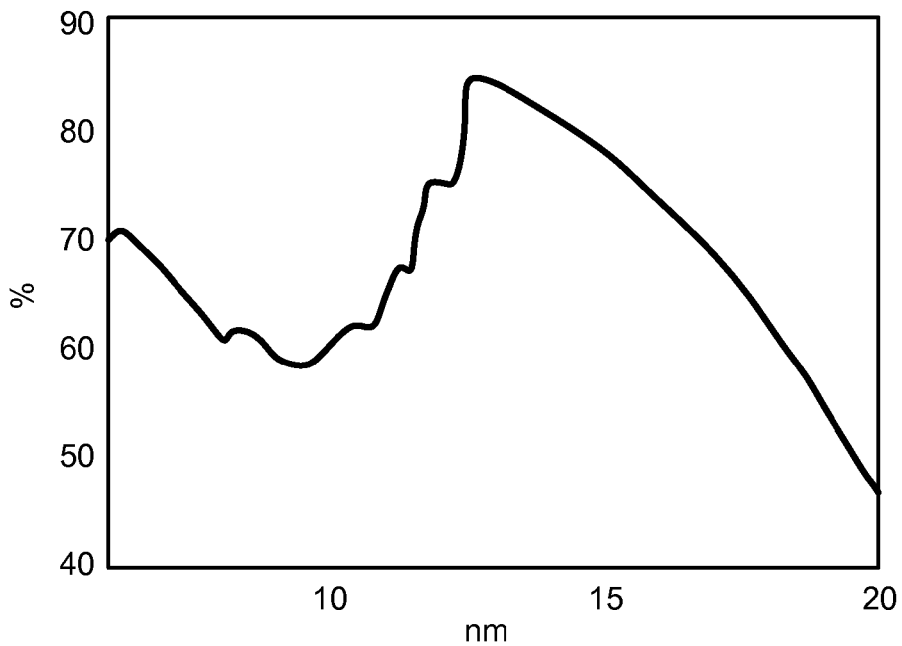
FIG. 15 shows a variation of EUV transmission with wavelength for a $MoSi_2$ membrane exposed to 20 hours at 0.65 W/cm² (no significant difference seen between central region and other regions of the membrane)
Figure 16:
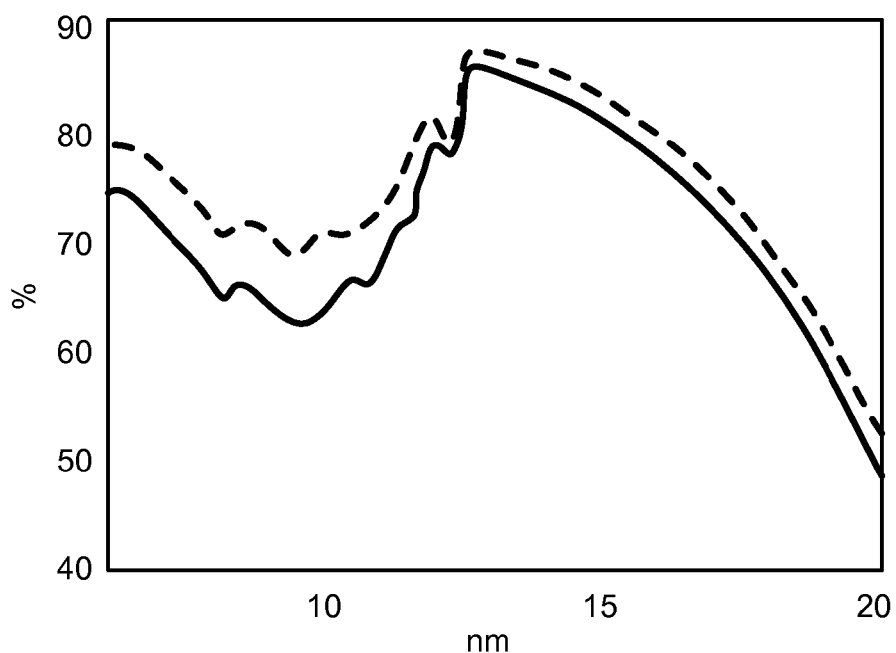
FIG. 16 shows a variation of EUV transmission with wavelength for a $MoSi_2$ membrane exposed to 20 hours at 1.8 W/cm² (dashed line showing transmission in a central region)

FIGS. 15 and 16 show a measured variation in transmission % as a function of EUV wavelength for 0.65 W/cm$^2$ absorbed (FIG. 15) and 1.8 W/cm$^2$ absorbed (FIG. 16). In the experiment of FIG. 15 the transmission was found to be roughly uniform over the whole membrane. In the experiment of FIG. 16, however, a considerably higher transmittance was found in a central region of the membrane 40 (shown by the broken line). The central region was also found to be glowing red. This suggests that the $MoSi_2$ was being etched away due to removal or damage to the protective scale in the central region.

The experiments of FIGS. 15 and 16 suggest that the embodiment of FIG. 8 could be used for lower EUV powers, while for higher EUV powers embodiments comprising additional protective layers, such as are described above with reference to FIGS. 3-6 may be desirable.

FIGS. 17-25 depict an example process flow for manufacturing a membrane 40 according to an embodiment. The process flow is not particularly limited. Various other process flows could be used as desired.

Figure 17:
FIGS. 17-25 depict an example process flow for manufacturing a membrane according to an embodiment.

FIG. 17 depicts a starting state comprising a silicon wafer 320.

Figure 18:
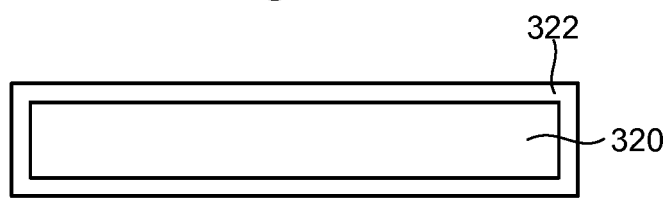

Thermal oxidation of the silicon wafer 320 forms an oxide layer 322, as shown in FIG. 18.

Figure 19:
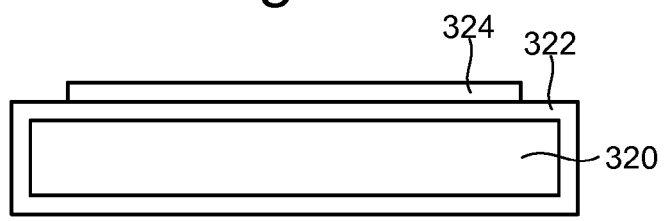

In a subsequent step, a $MoSi_2$ layer 324 is deposited onto the oxide layer 322, as shown in FIG. 19. The deposition may be performed using any suitable technique, for example chemical vapor deposition (CVD), atomic layer deposition (ALD) or physical vapor deposition (PVD).

Figure 20:
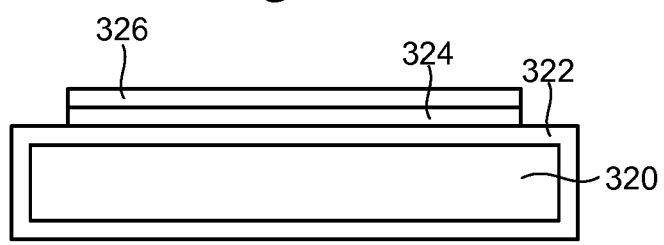

In a subsequent step, a tetraethylorthosilicate (TEOS) oxide layer 326 is formed on the $MoSi_2$ layer 324, as shown in FIG. 20.

Figure 21:
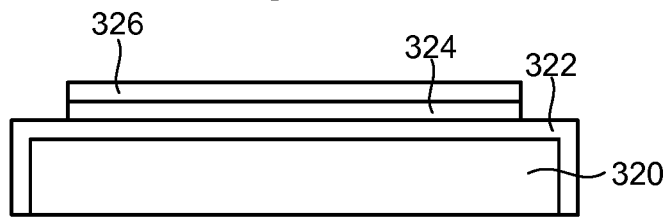

In a subsequent step, the oxide layer 322 is removed on a backside of the stack, as shown in FIG. 21.

Figure 22:
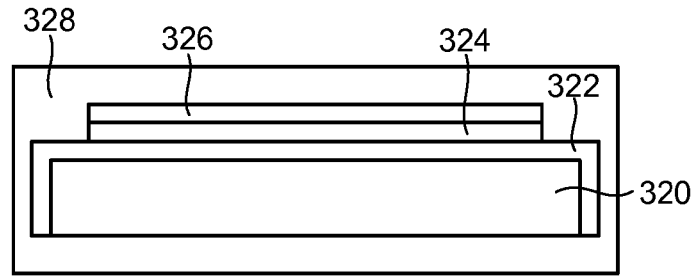

In a subsequent step, an encapsulation layer 328 is provided around the stack, as shown in FIG. 22. The encapsulation layer 328 may comprise a plasma enhanced chemical vapor deposition (PECVD) or low pressure chemical vapor deposition (LPCVD) deposited $Si_xN_y$ mask (e.g. $Si_3N_4$).

Figure 23:
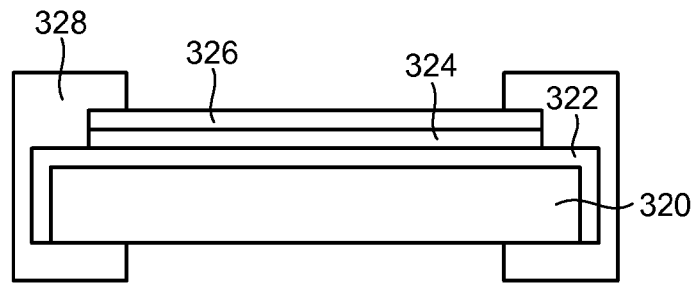
Figure 24:
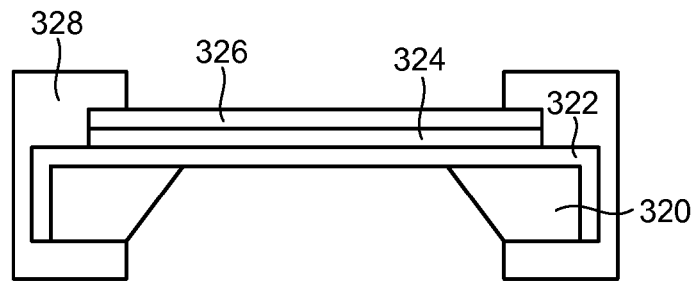
Figure 25:
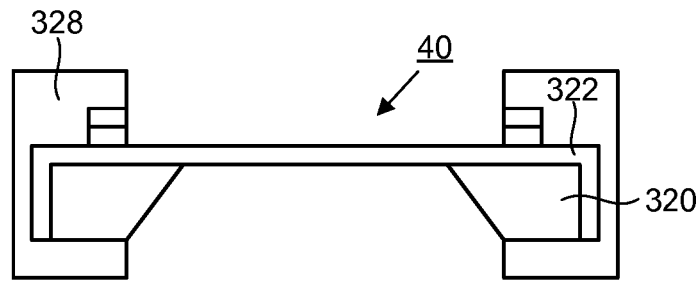

A subsequent step comprises patterning and dry etching of the windows in the encapsulation layer 328, as shown in FIG. 23.

In a subsequent step, KOH etching is applied to selectively remove a portion of the silicon wafer 320 on the backside.

Finally, wet or dry etching is applied to remove at least part of the TEOS layer 326 and the oxide layer 324 to form the membrane 40.

Figure 26:
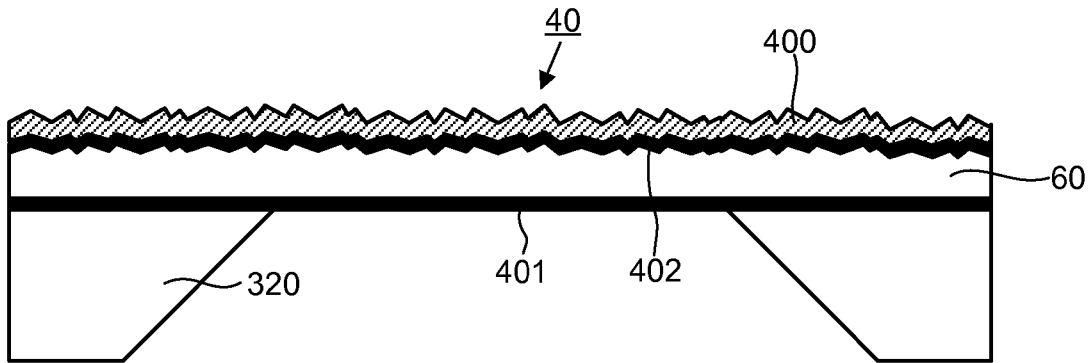
FIG. 26 schematically depicts, in cross-section, a membrane having an emissivity layer formed on an irregular support surface formed by anisotropic etching of a polysilicon base layer.
Figure 27:
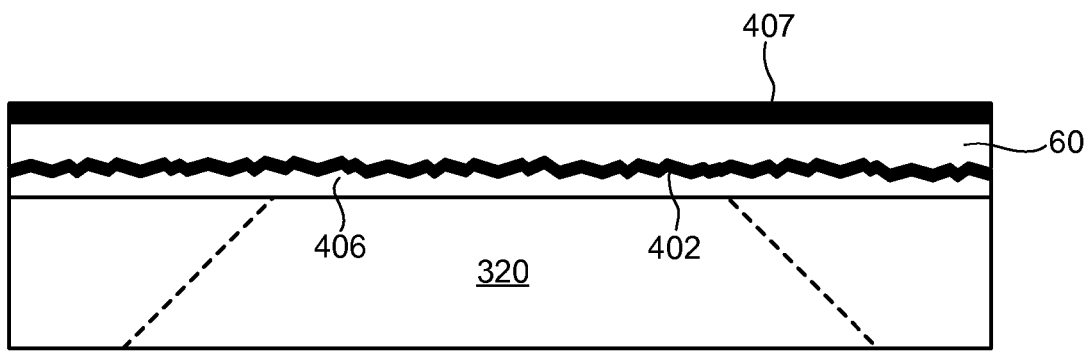
FIGS. 27 and 28 schematically depict, in cross-section, steps in a method of manufacturing a membrane having an emissivity layer formed on an irregular support surface formed by anisotropic etching of a layer of polysilicon provided in addition to the base layer.
Figure 28:
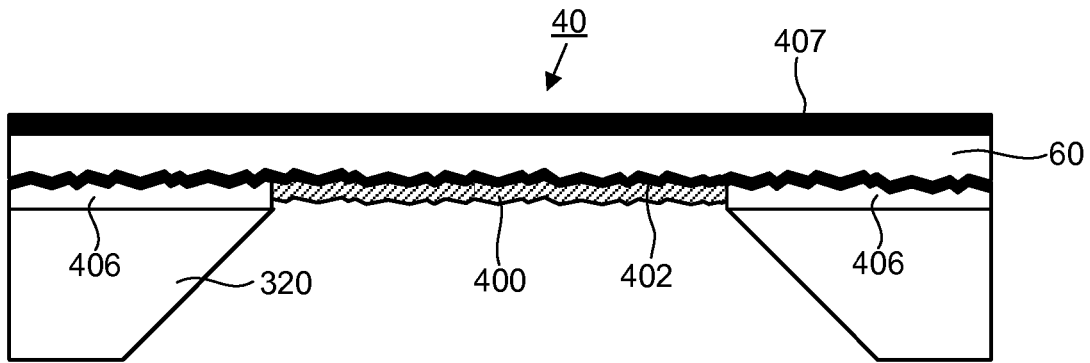

In embodiments described above a metal oxide material with high emissivity in the infrared (the compound comprising the second metal and the additional element, e.g. $MoSi_2$) is used for the base layer 60 of a membrane 40. Various different capping layers can be provided to improve robustness and reliability during use. FIGS. 26-28 illustrate example steps in a manufacturing process for producing an alternative membrane 40 with high emissivity in the infrared. The alternative membrane does not necessarily use the second metal and the additional element within the base layer 60. Standard materials such as polysilicon can be used for the base layer 60. High emissivity in the infrared is provided by an emissivity layer (a layer having high emissivity in the infrared) provided in addition to the base layer 60. The range of materials that can be used to provide the high emissivity is increased by adapting a topology of the surface of the emissivity layer to reduce damaging EUV reflection from emissivity layer.

The method comprises providing a base layer 60. The method further comprises providing an emissivity layer 400. The emissivity layer 400 has high emissivity in the infrared. For example, where the emissivity varies between 0 (minimum) and 1 (maximum), the emissivity may be greater than 0.2, optionally greater than 0.3, optionally greater than 0.4. The emissivity layer 400 therefore radiates heat away effectively and prevents the membrane 40 from overheating in use. In an embodiment, the emissivity of the emissivity layer 400 is higher than an emissivity of the base layer 60.

In an embodiment, the base layer 60 comprises polysilicon.

In an embodiment, the emissivity layer 400 comprises one or more of the following: Ru, Mo, Zr and Nb. Ru has been found to provide particularly good emissivity (when provided in a thickness range of about 1 nm-10 nm). When provided in a layer having a smooth surface, Ru and other materials have relatively high reflectivity for near normal incidence EUV (about 1% for Ru). This high reflectivity undesirably reduces contrast.

To make low EUV reflecting pellicles there are a couple of main strategies, such as use intrinsically low EUV reflective materials. Another strategy is to use a roughened interface and/or interlayer, as described below.

The reflectivity for near normal incidence is reduced by providing the emissivity layer 400 on an irregular support surface. The irregular support surface may be formed by a planar support layer 402 or by a surface of the base layer 60 (or both, where an irregularity in a surface of the base layer 60 is transferred to the planar support layer). The emissivity layer 402 has a thickness such that the irregularity of the irregular support surface produces a corresponding irregularity in the surface of the emissivity layer 400 that is opposite to the support surface. The irregularity in the surface of the emissivity layer 400 may be described as surface roughness in the case where the scale of the irregularity is relatively small. For a smooth film of 4 nm Ru on 30 nm of polysilicon, the inventors have found a normal incidence EUV reflectivity R=about 1.2%. By contrast, an emissivity layer 400 of Ru formed on an irregular support surface defined by a roughness of characteristic length scale 1 nm has R=about 0.5%. In an embodiment, the characteristic length scale is defined as the average peak-to-trough height difference of the surface topology. The in-plane separation between peaks should not be too high, however. Typically, the average in-plane separation between peaks is less than about 100 nm. An emissivity layer 400 of Ru formed on an irregular support surface defined by a roughness of characteristic length scale 3 nm has R less than 0.001%. In embodiments the irregularity in the surface of the emissivity layer 400 has a characteristic length scale of at least 2 nm, optionally at least 3 nm. The irregularity in the surface of the emissivity layer 400 may have significantly longer length scales than 3 nm, even up to and exceeding EUV wavelengths. Such an irregular surface may be described as a surface having facets with random directions and sizes. The facets redirect zero-order (normal incidence) reflections in random directions and out of image, thereby reducing or removing negative effects on contrast. The effect is similar to roughness even though the facets are significantly larger than the irregularities normally associated with surface roughness.

The irregular support surface may be formed in various ways. In one embodiment, either or both of the base layer 60 and a planar support layer 402 formed on the base layer 60 is processed to produce the irregular support surface. FIG. 26 depicts the result of a method of this type. In this embodiment, a bottom etched silicon wafer 320 supports from the bottom up: a lower capping layer 401 (e.g. $Si_3N_4$), a polysilicon base layer 60, a planar support layer 402, and the emissivity layer 400. An anisotropic etch is applied to the upper surface of the polysilicon base layer 60 before deposition of the planar support layer 402. The crystallite size of the polysilicon is selected so that the anisotropic etch produces an upper surface in the base layer 60 that has the desired irregularity. The planar support layer 402 is then provided in a layer that is sufficiently thin that the irregularity of the upper surface of the base layer 60 produces a corresponding irregularity in the upper surface of the planar support layer, thereby forming the desired irregular support surface for the emissivity layer 400. The emissivity layer 400 is similarly provided in a layer that is sufficiently thin that the irregularity in the upper surface of the planar support layer 402 produces a corresponding irregularity in the surfaces of the emissivity layer 400. The planar support layer 402 and emissivity layer 400 may for example have thicknesses in the range of about 1 nm to about 10 nm.

FIGS. 27 and 28 depict stages in an alternative method for forming the emissivity layer 400, in which an additional layer 406 is provided between the silicon wafer 320 and the base layer 60. In an embodiment the additional layer 406 is comprises a polycrystalline material such as polysilicon. The additional layer 406 is processed to produce an irregular upper surface prior to deposition on the upper surface of a planar support layer 402 (e.g. $Si_3N_4$). The processing may comprise anisotropic etching for example. The base layer 60, which may for example also comprise a polycrystalline layer such as polysilicon, is formed on the planar support layer 402. In the embodiment shown, an upper capping layer 407 (e.g. $Si_3N_4$) is formed on the base layer 60, thereby providing the arrangement shown in FIG. 27. Backside etching is subsequently applied to remove a portion of the silicon wafer 320 and a portion of the additional layer 406 up to a bottom surface of the planar support layer 402 (which may act as an etch stop). The lower surface of the planar support layer 402 is an irregular support surface due to the planar support layer 402 having been formed originally on the irregular upper surface of the additional layer 406. An emissivity layer 400 is then deposited on the irregular support surface to produce the arrangement of FIG. 28. The emissivity layer 400 is provided in a layer that is sufficiently thin that the irregularity in the irregular support surface produces a corresponding irregularity in both surfaces of the emissivity layer 400.

In arrangements of the type shown in FIG. 28, the irregularity (e.g. roughness) provided to the additional layer 406 between the base layer 60 and the silicon wafer 320 may also improve adhesion between the base layer 60 and the silicon wafer 320.

In embodiments in which the irregular support surface is formed by anisotropic etching of a polycrystalline material, an average angle, relative to the normal to the membrane, of crystallite faces in the irregular support surface is preferably less than 85%, optionally less than 80%, optionally less than 70%, optionally less than 60%, optionally less than 50%. This property can be achieved through suitable selection of crystallite sizes in the polycrystalline material and etching conditions in the anisotropic etch. Deviations from 90 degrees will cause specular reflections of normal incidence radiation from the crystallite faces to be directed away from the normal direction. For the angles less than 90 degrees mentioned above it has been found that a large proportion of specular reflections will be directed so far away from the normal that they will not be captured by imaging apparatus and will not therefore have a negative impact on contrast.

Figure 29:
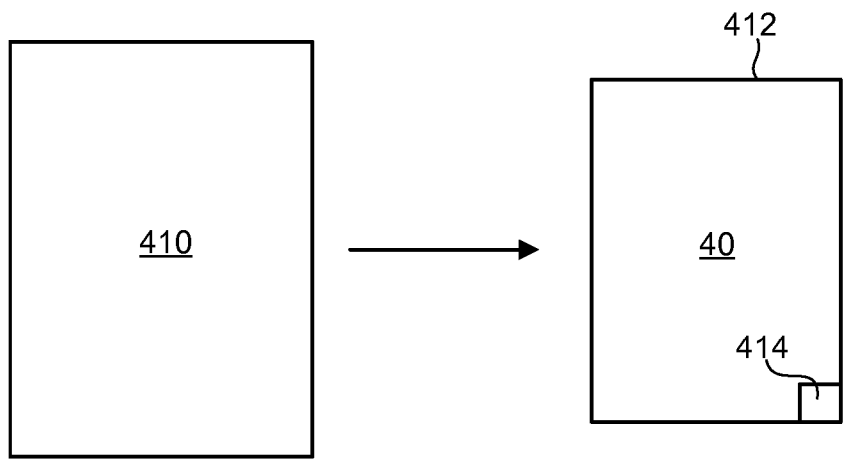
FIG. 29 depicts schematic top views of a mask (left) used to define a region to be etched to release a membrane and a resulting freestanding portion of the membrane (right), wherein the mask and freestanding portion have 90 degree corners.

As depicted schematically in FIG. 29, membranes are typically formed using a rectangular mask 410 (left) to define a region of a support structure (e.g. silicon wafer) to remove by etching and thereby release the membrane 40. A freestanding portion of the resulting membrane 40 (right) will have the same overall shape as the mask 410. The shape of the freestanding portion of the membrane 40 is defined by a freestanding portion boundary line 412. In the case of a rectangular mask 410, the freestanding portion boundary line 412 will comprise four straight sides with 90 degree corners 414 (within a small angular range). The inventors have found that the 90 degree corners 414 cause significant stress concentrations in the freestanding portion of the membrane 40. The stress concentrations increase the chances of failure of the membrane 40 and/or shorten membrane 40 lifetime. The stress concentrations form due to slight changes in size of the membrane 40 during manufacturing, which mean that the membrane 40 no longer exactly fits the supporting frame (causing bulging out for example).

The inventors have found that producing corners with interior angles that are greater than 90 degrees reduces or avoids the stress concentration. The reliability and/or lifetime of the membrane 40 can thereby be improved. Optical disturbances near corners are also reduced.

Figure 30:
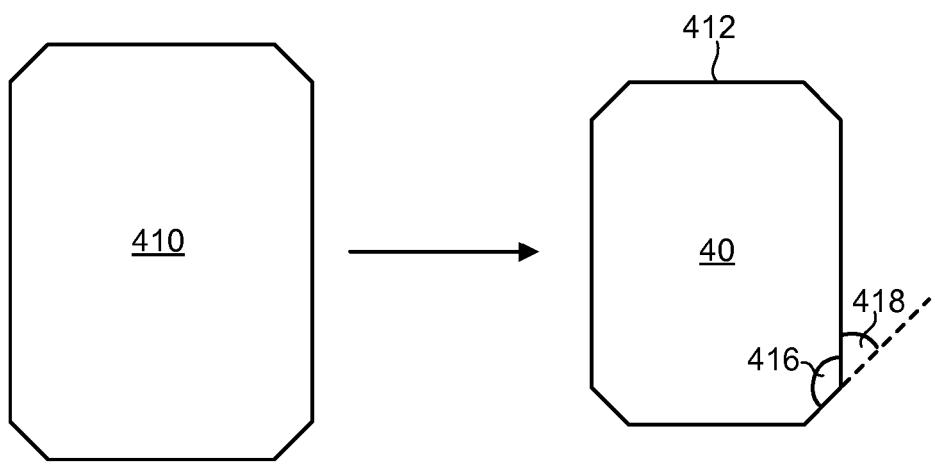
FIG. 30 depicts schematic top views of a mask (left) used to define a region to be etched to release a membrane and a resulting freestanding portion of the membrane (right), wherein the mask and freestanding portion have corners with interior angles greater than 90 degrees to reduce stress concentration in the corners.

Accordingly, in an embodiment, as depicted for example in FIG. 30, there is provided a membrane 40 for EUV lithography. The membrane 40 may be produced for example using a mask 410 (left) to define a region of a support structure to be etched and then etching the defined region. The support structure may comprise a silicon wafer supporting layers of the membrane 40. Etching of the defined region comprises removing a portion of the silicon wafer to release the membrane 40. A portion of the membrane 40 becomes freestanding. A shape of a freestanding portion of the membrane 40 is defined by a freestanding portion boundary line 412 (right). The freestanding portion boundary line 412 comprises a plurality of substantially straight sections. In the example shown in FIG. 30, the freestanding portion boundary line 412 comprises eight substantially straight sections. The interior angle 416 between each pair of directly adjacent straight sections is arranged to be greater than 90 degrees, optionally at least 95 degrees, optionally at least 100 degrees, optionally at least 110 degrees, optionally at least 120 degrees. This is shown for just one of the interior angles in FIG. 30 but it can clearly be seen that all of the interior angles 416 are greater than 90 degrees. The exterior angle 418, which is 180 degrees minus the interior angle 416, will be less than 90 degrees. Stress concentrations are thereby reduced and membrane reliability and/or longevity improved. Optical disturbances (caused by the stress concentrations) near corners of the membrane 40 are also reduced.

Where anisotropic etching is used to release the membrane 40, the etching will follow crystallographic planes. This may mean that the interior angle 416 does not fully dictate the morphology of corners at a microscopic scale. However, the transition from one straight section to another straight section provided by this embodiment is still improved in terms of reducing stress concentration than where 90 degree corners are provided. The lost pellicle area in the corner (relative to the rectangular case) does not have to be very large (it can be of the order of about 10-100 square microns, for example). The change in the geometry of the corners can therefore easily be designed not to interfere with the region of the membrane 40 through which the EUV radiation will pass in use.

Figure 31:
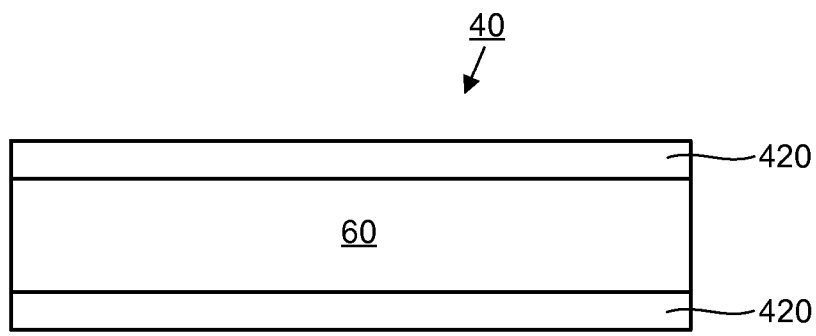
FIG. 31 schematically depicts, in cross-section, a membrane having a base layer and capping layers, wherein the capping layers comprise an alloy of Mo with at least one other metal, or comprises borosilicate glass.

Membranes 40 comprising base layers 60 formed from polysilicon or the compound comprising the second metal and the additional element (e.g. $MoSi_2$) can form a native oxide (protective scale), e.g. $SiO_2$, that protects the base layer from excessive oxidation. The native oxide may however be etched away by EUV radiation and eventually cease to protect the base layer 60 fully during use. The inventors have found that a capping layer comprising borosilicate glass can provide improved protection of the base layer 60. FIG. 31 shows an example arrangement in which a membrane 40 comprises a base layer 60 protected on each side by a capping layer 420 comprising borosilicate glass. A capping layer 420 comprising borosilicate glass can usefully be used in combination with a wide variety of base layer 60 compositions, including polysilicon, the compound comprising the second metal and the additional element, and various other compositions such as MoC and other carbides.

The borosilicate glass may be formed in place of a native oxide of the base layer 60. Alternatively, the borosilicate glass may be formed by transforming a native oxide of the base layer into borosilicate glass. Alternatively, the borosilicate glass may be formed so as to cover a native oxide of the base layer 60.

The variety of borosilicate glass compositions available allow desirable tuning of the properties of the capping layer 420. The inventors have found that it is possible for example to achieve superior stability relative to the native oxide by appropriate selection of the composition of the borosilicate glass.

CMOS-compatible methods of depositing thin layers of borosilicate glass are known in the art (see, for example, J. Leib O. Gyenge, U. Hansen, S. Maus, K. Hauck, I. Ndip, M. Toepper, Low Temperature Glass-Thin-Films for use in Power Applications, 2011 Electronic Components and Technology Conference, 978-1-61284-498-5/11). The methods are reported to yield coatings with coefficients of thermal expansion (CTEs) very closely matching the CTE of Si. Where the base layer 60 comprises polysilicon, this matching should result in superior mechanical properties in high power EUV applications in comparison to native oxide layers (where the CTEs will generally match less well). Moreover, formulations of borosilicate glass are available which can be softened at relative lower temperatures, reducing the risk of crack formation and the associated loss of protective properties.

Various techniques are available for depositing the borosilicate glass capping layer 420. Three examples are given below for the case where the base layer 60 is initially provided with a native oxide (e.g. a 1.5-2 nm layer $SiO_2$) on the outer surfaces of the base layer 60.

In a first example method, the native oxide is stripped off. This may be achieved for example by immersing the membrane 40 in HF. A layer of borosilicate glass (e.g. a few nm thick, for example 2 nm thick) is then deposited on the base layer 60 to form the capping layer 420. Plasma-enhanced E-beam deposition can be used for example to deposit the borosilicate glass.

In a second example method, a layer of borosilicate glass is deposited on top of the native oxide. This arrangement provides enhanced protection against oxidation but the presence of the native oxide will reduce EUV transmissivity.

In a third example method, $SiO_2$ as the native oxide is converted to borosilicate glass. This can be achieved for example by reacting the $SiO_2$ with $B_2O_3$ and other additives known in the art for such conversion. For example, a $B_2O_3$ layer may be co-deposited on $SiO_2$ together with $Na_2O$, $Li_2O$, $P_2O_5$ or whatever is needed for a glass of desired properties. A high temperature annealing step may be applied to complete the transformation.

In an alternative embodiment, the capping layer 420 comprises an alloy of Mo with at least one other metal, such as one or more of the following: Ta, Ti, Cr, Ni and Nb. Such a capping layer 420 may be used for example in combination with base layer 60 comprising polysilicon. Mo has desirably high emissivity in infrared but undergoes oxidation in air even at room temperature and will rapidly oxidize at higher temperatures. Additional capping layers could be provided to protect the Mo from oxidation but this would increase complexity of the membrane 40. The alloying of the Mo with another metal greatly reduces the oxidation of the Mo without requiring additional capping layers. Alloying of Mo with less than about 5 wt. % of the other metal is expected to substantially increase stability of the Mo against oxidation (see for example A. List, C. Mitterer, G. Mori, J. Winkler, N. Reinfried, W. Knabl, Oxidation of Sputtered Thin Films of Molybdenum Alloys as Ambient Conditions, 17th Plansee Seminar 2009, Vol. 1). Alloying of Mo with Ti and alloyed of Mo with Ta provide particularly good protection against oxidation. The capping layer 420 formed from such an alloy is thus effectively a bifunctional layer providing both the function of high emissivity in the infrared and the function of protecting against oxidation.

In an alternative embodiment, a membrane 40 is provided with a base layer 60 comprising one or more of the following: $YSi_2$, $ZrSi_2$, $LaSi_2$ and $NbSi_2$. Each of these four materials is even more transparent to EUV than $MoSi_2$. $YSi_2$ and $ZrSi_2$ are particularly effective, providing EUV transparencies that are up to twice the EUV transparency of $MoSi_2$. The emissivity and thermo-mechanical properties of the four materials are similar to $MoSi_2$. The high emissivity means that no additional emissive metal layers are needed. The thermo-mechanical properties mean that the base layer 60 can be made substantially thinner than a polysilicon alternative, which also helps to promote high EUV transmissivity. A base layer 60 formed from $YSi_2$, $ZrSi_2$, $LaSi_2$ or $NbSi_2$ will not be stable against oxidation, so a capping layer 430 may be provided to provide protection against oxidation.

Figure 32:
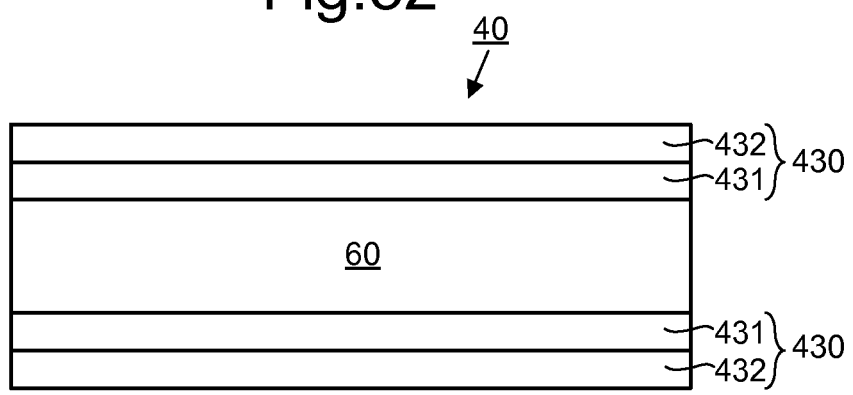
FIG. 32 schematically depicts, in cross-section, a membrane having a base layer, capping layer first sub-layers comprising $MoSi_2$ or Si, and capping layer second sub-layers comprising B.

An example membrane 40 of this type is shown in FIG. 32. The membrane 40 comprises one or more of $YSi_2$, $ZrSi_2$, $LaSi_2$ and $NbSi_2$. A capping layer 430 is provided. In the particular example shown the capping layer 430 is provided on both of the upper and lower surfaces of the base layer 60.

In the example shown the capping layer 430 comprises a capping layer first sub-layer 431 and a capping layer second sub-layer 432. The capping layer first sub-layer 431 is in contact with the base layer 60 and the capping layer second sub-layer 432 is positioned on a side of the capping layer first sub-layer 431 opposite to the base layer 60. In an embodiment the capping layer first sub-layer 431 comprises $MoSi_2$ or Si. Various materials can be used to form the capping layer second sub-layer 432. In one embodiment the capping layer second sub-layer 432 comprises B.

In one detailed example, the membrane 60 is manufactured by provided a base layer 60 comprising $YSi_2$ or $ZrSi_2$ at a thickness of 20-30 nm. In a subsequent step, a capping layer first sub-layer 431 of Si or MoSi2 (2-4 nm) is applied to the base layer 60 (to provide an anti-oxidation barrier and allow the stack to be robust against typical manufacturing process flow conditions). In a subsequent step, $SiO_2$ native oxide is removed to increase EUV transmissivity (e.g. using a He/H plasma etch). The removal of the $SiO_2$ native oxide also provides dangling bonds which improve binding between the capping layer first sub-layer 431 and the capping layer second sub-layer 432 to be applied subsequently. In a subsequent step the capping layer second sub-layer 432 is applied on the capping layer first sub-layer 431 (e.g. B). The capping layer second sub-layer 432 is applied in-situ and ensures that a $SiO_2$ native oxide does not reform on the capping layer first sub-layer 431.

In the absence of counter-measures, capping layers can degrade during EUV exposure conditions. It has been observed for example that metals such as Ru, Mo, B, and Zr (and combinations including respective alloys, Borides, Carbides or Silicides thereof) are oxidized. Oxidation reduces EUV transmission. Due to the reduction of metal content and corresponding conductivity, oxidation also decreases the emissivity of the membrane. Chemical stability may be compromised due to the oxide surfaces containing reactive O vacancies. Any change in the capping layer thickness, composition and roughness will also impact the EUV reflectivity. The inventors have recognized that an important factor in the oxidation resistance and chemical stability of capping layers is the crystalline microstructure. Many typical capping layers, particularly metallic capping layers, are polycrystalline. Grain boundaries cause poor performance as an oxidation barrier because grain boundaries provide paths for atomic diffusion. Grain boundaries are also more susceptible to chemical attack than the grain interior due to their imperfect structure. Embodiments of the present disclosure provide improved performance by providing an amorphous capping layer.

In an embodiment, a method of manufacturing a membrane 40 comprises providing a base layer 60 (or a stack comprising a base layer 60 and one or more other layers) and a capping layer 70. The capping layer 70 is an amorphous capping layer. The capping layer 70 provides an outer surface of the membrane 40. The base layer 60 and capping layer 70 may adopt the general configuration of FIG. 3, for example. In this configuration, two of the capping layers are provided (a first capping layer 70 and a second capping layer 80). In other embodiments the capping layer 70 may be provided on one side only of the membrane 40 (e.g. in the case of a membrane for protecting a patterning device, the capping layer 70 may be provided on the side of the membrane 40 facing the patterning device). The composition and thickness of the base layer 60 and of any other layers may be as described in any of the above embodiments or other compositions and thicknesses may be used. The advantages of providing an amorphous capping layer 70 do not particularly depend on the nature of the other layers of the membrane 40. The approach can therefore be applied to present membrane designs and future membrane designs, including for example base layers comprising polysilicon, SiN, $MoSi_2$, and graphene.

In an embodiment, the capping layer 70 is metallic. In an embodiment, the capping layer 70 comprises an alloy. As will be described in further detail below, use of an alloy can inhibit crystallization in the capping layer 70, thereby promoting the amorphous state. In an embodiment the alloy comprises one or more of the following: Ru, Mo, B, C, Cr, Ir, Nb, Pd, Pt, Re, Rh, Ti, V, Y, preferably one or more of the following: B, C, Y. For example: 1) Ru with one or more of Rh, Pd, Pt, Y, B, Ti, C and P; and 2) Mo with one or more of B, Ta, Nb, Cr and Ru.

In an embodiment, the alloy comprises Ru doped with B (e.g. 10-20% B), Ru doped with P, or $Mo_{(1-x-y)}Ru_xB_y$. These materials provide higher resistance to penetration by H, O, and $H_2O$ than pure Ru. Increased stability when exposed to EUV, $H_2$ plasma, and thermal load are also achieved, with the beneficial amorphous structure being retained in these conditions. Surface reaction properties are improved relative to pure Ru, with less reactance in respect of metallic contaminants originating for example from metal-containing resist on the substrate W. Cleanability of the capping layer 70 is therefore improved. In an embodiment, a graded concentration profile within the capping layer is provided, with a concentration of the dopant (e.g. B or P) being higher near at least one of the surfaces of the capping layer 70 than at positions deeper within the capping layer 70, thereby providing high cleanability without excessive overall levels of dopant.

The increased resistance to oxidation provided by the absence of grain boundaries will reduce the variation in EUV transmission and EUV reflection over time. Preserving the metallic nature of the capping layer 70 will minimize changes in emissivity, allowing the membrane to survive at high temperature for longer.

The amorphous character of the capping layer 70 also leads to a reduction in reflectivity for many choices of material: the optical contrast between the capping layer 70 and the base layer 60 of the membrane 40 is normally lower when the capping layer 70 is amorphous compared to when the capping layer 70 is polycrystalline.

Example approaches for manufacturing a membrane 40 having an amorphous capping layer 70 are described below.

In an embodiment, the forming of the amorphous capping layer 70 comprises simultaneously depositing (e.g. by co-sputtering) at least two different metals to form an alloy. The different sizes of the different types of metal atoms disrupts the crystallization process, thereby promoting creation of an amorphous layer. During the co-deposition process, a bias can be applied to increase the energy of the particles impinging the surface of the layer being formed, which alters the phase formation. The applied bias thus contributes to the amorphization of the capping layer 70. The applied bias can also conveniently be used to tune other properties of the capping layer 70 that are dependent on the film microstructure (e.g. stress, resistivity, adhesion).

In an alternative embodiment, the forming of the amorphous capping layer 70 comprises depositing the amorphous capping layer 70 in the presence of a first gas and a second gas, wherein the presence of the second gas inhibits crystallization of the amorphous capping layer 70 in comparison with the same deposition process performed in the presence of the first gas only. The inclusion of such a second gas during the formation (e.g. deposition), such as small amount of nitrogen (N) added to argon (Ar), can disrupt the structure of the deposited amorphous capping layer 70, thereby promoting formation of an amorphous rather than crystalline structure. The second gas (e.g. nitrogen) may reduce the atomic mobility and the activation energy of the atoms being deposited. The second gas (e.g. nitrogen) may slow down the crystallization kinetics, thereby stabilizing the amorphous phase.

In an alternative embodiment, the forming of the amorphous capping layer 70 is performed while the base layer 60 (or stack comprising the base layer 60 and other layers) is held at a temperature below room temperature to inhibit crystallization. Thus, the membrane 40 may be pre-cooled prior to deposition and actively kept at a low temperature during the deposition process (e.g. using water or gas as a coolant). The low temperature suppresses crystalline grain growth and suppresses interdiffusion/interlayer formation. Once the deposition process is completed, the energy necessary for the atoms to move and to interdiffuse has increased. Therefore, warming up to room temperature is no longer sufficient to initiate the interdiffusion process and the capping layer 70 will stay in a stable amorphous phase.

The degree of amorphization of the amorphous capping layer 70 can be measured and monitored using various techniques, including for example atomic force microscopy (AFM), transmission electron microscopy (TEM) and scanning electron microscopy (SEM) measurements, therefore contributing to improve the quality of the product through process control.

The advantages associated with providing an amorphous capping layer 70 discussed above are not only applicable to membranes such as pellicles. The advantages in terms for example of increased resistance to H, O, $H_2O$, EUV, $H_2$ plasma, thermal load, etc. are also applicable to EUV mirrors or reflective reticles. It is additionally expected than B- or P-doped Ru and/or $Mo_{(1-x-y)}Ru_xB_y$, for example, will have superior optical properties to pure Ru (e.g. lower EUV absorption and higher reflectivity) or Mo. For EUV mirrors, the B- or P-doped Ru and/or $Mo_{(1-x-y)}Ru_xB_y$ is expected to reduce blistering as well as providing an improved undersurface for any $ZrO_2$ overcoating. The reducing reactivity with respect to metallic contaminants (e.g. Sn) may even make overcoatings such as $ZrO_2$ unnecessary. Mo layers in multilayer reflective structures may be replaced by B- or P-doped Ru and/or $Mo_{(1-x-y)}Ru_xB_y$, thereby providing lower roughness per layer and lower EUV scattering.

In an alternative embodiment, a membrane 40 for EUV lithography is provided which has a base layer 60 and a capping layer 70. The capping layer comprises carbon having a proportion of $sp^3$ carbon of at least 20% (less than 80% $sp^2$ carbon), optionally at least 50%, optionally at least 75%, optionally substantially 100%. The capping layer 70 provides an outer surface of the membrane 40. Carbon containing both $sp^3$ and $sp^2$ carbon is referred to as diamond-like carbon. $sp^3$ carbon has high EUVT, is resistant to etching by H plasma and can withstand high temperatures. Moreover, $sp^3$ carbon does not present any risk of issues associated with optics lifetime as $sp^2$ carbon deposited on surfaces from gas phase can be cleaned with H plasma. The base layer 60 and capping layer 70 may adopt the general configuration of FIG. 3, for example. In this configuration, two of the capping layers are provided (a first capping layer 70 and a second capping layer 80). In other embodiments the capping layer 70 may be provided on one side only of the membrane 40 (e.g. in the case of a membrane for protecting a patterning device, the capping layer 70 may be provided on the side of the membrane 40 facing the patterning device). The composition and thickness of the base layer 60 and of any other layers may be as described in any of the above embodiments or other compositions and thicknesses may be used. The capping layer 70 can be provided for example on a base layer 60 comprising any one or more of the following: $MoSi_2$, $B/B_4C$, pSi, $ZrSi_2$, graphene, and others.

In an embodiment, the capping layer 70 can be used as an alternative to boron and $ZrO_2$ for a Si-containing base layer 60 for example. In another embodiment, the capping layer 70 is used in combination with a base layer 60 comprising carbon, for example multilayered graphene or carbon nanotubes, thereby providing valuable resistance against H plasma. In an embodiment the provision of an all carbon base layer 60 and an all carbon capping layer 70 allows the membrane 60 as a whole to be formed from a single chemical element, thereby reducing the risk of the membrane 60 contaminating the environment in which the membrane 60 is used with problematic elements. The membrane 60 is superior to a graphene only pellicle due to the ability to withstand higher temperatures and H plasma due to the capping layer 70. In an embodiment, both the base layer 60 and the capping layer 70 are formed from carbon but the base layer 60 is less diamond like (i.e. contains a lower proportion of $sp^3$ carbon) than the capping layer 70. Thus, base layer 60 may comprise carbon in which a proportion of $sp^3$ carbon is lower than the proportion of $sp^3$ carbon in the carbon of the capping layer 70. Diamond has very low IR emissivity in comparison with pure $sp^2$ carbon, so for pure carbon membranes, the pure $sp^2$ carbon component (or a component having a high proportion of $sp^2$ carbon) will be needed to provide a sufficiently high IR emissivity.

The proportion of $sp^3$ carbon has a strong influence on the properties of the layer. Pure diamond is pure $sp^3$ and has excellent etch resistance (diamond is etched from 75 to 7000 times more slowly than graphite by low energy H atoms).

Manufacturing using pure diamond is challenging but layers of diamond-like carbon containing both $sp^3$ and $sp^2$ carbon show markedly improved etch resistance in comparison with pure $sp^2$ carbon.

Various processes are known for depositing diamond-like carbon, including for example plasma enhanced CVD, deposition, ion-assisted deposition, sputtering, cathodic vacuum arc (CVA), plasma deposition, and pulsed laser deposition (PLD). Variations in the deposition method will determine the $sp^3/sp^2$ ratio that is achieved. The deposition method can therefore be chosen as a function of the $sp^3/sp^2$ ratio desired. Ultra thin films can typically reach an $sp^3/sp^2$ ratio of about 1 (50% $sp^3$).

In an alternative embodiment, a membrane 40 for EUV lithography is provided which has a base layer 60 and a capping layer 70 comprising a first metal doped with a second metal. The capping layer 70 provides an outer surface of the membrane 40. In an embodiment, the first metal comprises a transition metal. In an embodiment, the second metal comprises an alkali metal or an alkaline earth metal. The base layer 60 and capping layer 70 may adopt the general configuration of FIG. 3, for example. In this configuration, two of the capping layers are provided (a first capping layer 70 and a second capping layer 80). In other embodiments the capping layer 70 may be provided on one side only of the membrane 40 (e.g. in the case of a membrane for protecting a patterning device, the capping layer 70 may be provided on the side of the membrane 40 facing the patterning device). The composition and thickness of the base layer 60 and of any other layers may be as described in any of the above embodiments or other compositions and thicknesses may be used.

Doping of metals, particularly transition metals, particularly Ru, with other metals, particularly alkali or alkaline earth metals, particularly Sr or Ca, provides improved performance in various ways.

The doping can increase thermal stability of the capping layer 70. The alkaline earth metals have relatively high vapor pressures and can therefore reduce the volatility of the material being doped. For example, in the case of Ru doped with Sr, the higher vapor pressure associated with Sr means that the volatility of the Ru is reduced.

The doping can increase the uniformity of the capping layer 70 by relaxing the epitaxial strain in the capping layer 70.

The doping can increase EUV transmission. For example, in the case of Ru doped with Sr, higher transparency is achieved because Sr is significantly more transparent to EUV than Ru.

The doping can increase EUV reflection. For example, in the case of Ru doped with Sr, the Sr decreases the difference in index of refraction between the capping layer 70 and the base layer 60.

The alkaline earth metals are stable elements and can be doped to a higher concentration before phase segregation occurs (a typical doping range is of the order of 1-10%). Moreover metallic Sr can contribute to the Fermi level of Ru to promote enhanced conductivity/emissivity.

The doping can be implemented in various ways, including for example different PVD techniques, and can therefore be efficiently integrated into existing manufacturing flows. Co-sputtering Sr together with Ru (from separate targets) would be suitable in the case of doping Ru with Sr. Alternatively, the Ru-target could be doped with Sr. CVD can also be used with for example $Sr_3(CO)_{12}$ as chemical precursors of Sr.

The extent of doping can be measured for example by X-ray photoelectron spectroscopy (XPS), secondary ion mass spectrometry (SIMS) and Rutherford backscattering spectroscopy (RBS). At lower concentration of dopant, where measurement becomes more difficult, good control of the metallic flux during deposition is known to yield desired stoichiometry in films.

In an alternative embodiment, a membrane 40 for EUV lithography is provided which has a base layer 60 and a capping layer 70 comprising $M1_xM2_yO_z$, where M1 comprises one or more alkali metal and/or one or more alkali earth metal, and M2 is a transition metal, optionally a rare-earth metal. The capping layer 70 provides an outer surface of the membrane 40. In an embodiment, the capping layer 70 comprises one or more of the following: $SrRuO_3$, $SrVO_3$, $CaVO_3$, $La_{0.67}Sr_{0.33}MnO_3$. The base layer 60 and capping layer 70 may adopt the general configuration of FIG. 3, for example. In this configuration, two of the capping layers are provided (a first capping layer 70 and a second capping layer 80). In other embodiments the capping layer 70 may be provided on one side only of the membrane 40 (e.g. in the case of a membrane for protecting a patterning device, the capping layer 70 may be provided on the side of the membrane 40 facing the patterning device). The composition and thickness of the base layer 60 and of any other layers may be as described in any of the above embodiments or other compositions and thicknesses may be used. $M1_xM2_yO_z$ materials provide various advantages as capping layers. The materials are exceptionally stable and non-volatile. A wide range of range of lattice constants are available, facilitating formation of capping layers with low or no strain. The flexible band structure allows the materials to be tuned easily. By doping and applying different strains it is possible to shift their Fermi level electron densities, thus allowing control of their conductivity and emissivity.

$M1_xM2_yO_z$ materials have relatively high EUV transmission compared to other metals and alloys. Moreover, flexibility in their composition and crystal structure makes it possible to tune the optical properties to match with other layers in the membrane, thereby reducing reflectance.

High quality $M1_xM2_yO_z$ material layers can be deposited using many physical vapor deposition (PDV) techniques like RF-sputtering, molecular beam epitaxy (MBE), e-beam evaporation and pulsed laser ablation (PLD). Some of these techniques are so advanced that they can control the film thickness down to atomic layers, which is particularly advantageous for membranes 40 for use in EUV lithography.

The physical properties (e.g. conductivity) of $M1_xM2_yO_z$ material layers can be measured using 4-probe PPMS technique. These layers are generally very stable w.r.t. measurement conditions, so any in-plane and out of plane measurement technique can be used to measure their properties.

Various promising base layer materials, including for example $MoSi_2$, $ZrSi_2$, and other silicides, as well as multilayer graphene, have been observed to have excessively high (in the case of $MoSi_2$, $ZrSi_2$, and other silicides) or excessively low (in the case of multilayer graphene) stress when formed into a freestanding membrane. Excessively high stresses cause premature failure of membranes. Excessively low stresses cause undesirable wrinkling of membranes. The inventors believe the undesirable levels of stress are caused by mismatching in the coefficient of thermal expansion between a support structure supporting the base layer when the base layer is deposited and the base layer itself. Membranes typical undergo one or more high temperature steps during manufacture. For example, annealing may be carried out at temperatures above 700° C. to optimize density and prevent annealing and shrinkage of the membrane in use. Deposition techniques can use high temperatures. CVD of multilayer graphene may need to be performed at temperatures above 700° C. for example. At these high temperatures the base layer relaxes into its lowest stress state, constrained by the much thicker support structure. When the assembly is subsequently cooled, the base layer and the support structure contract by different amounts depending on the mismatch in thermal expansion coefficients. If the support structure has a higher thermal expansion coefficient it will shrink more than the base layer, leading to a wrinkled base layer. If the support structure has a lower thermal expansion coefficient it will shrink less than the base layer, leading to high stresses in the base layer.

Figure 34:
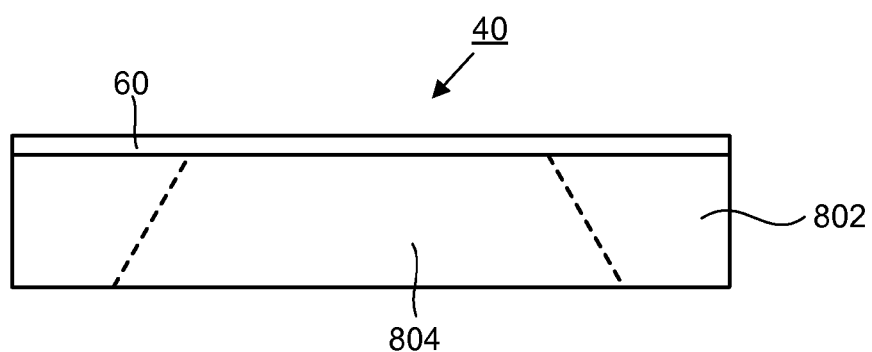
FIG. 34 schematically depicts a stage in a method of manufacturing a membrane.
Figure 35:
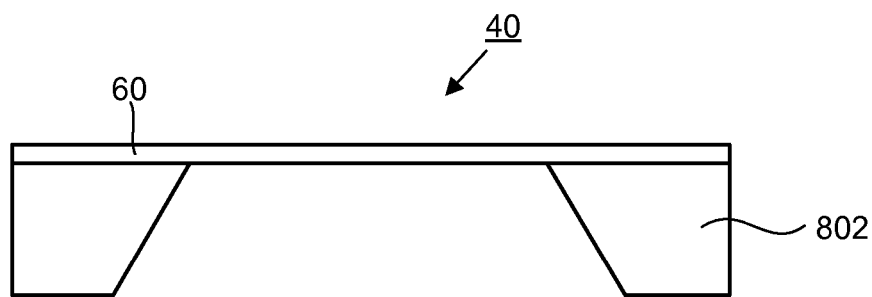
FIG. 35 schematically depicts a further stage in the method of manufacturing of FIG. 34.

FIGS. 34 and 35 depict steps in a method according to an embodiment, in which a membrane 40 is manufactured in such a way as to reduce the problems associated with mismatching coefficients of thermal expansion discussed above. The method comprises forming a base layer 60 on a support structure 802 to provide the arrangement shown in FIG. 34. The support structure 802 is then etched in a selected region 804 underneath the base layer 60 (a boundary line of the selected region 804 is depicted by broken lines) to form a freestanding membrane 40 comprising the base layer 60, as shown in FIG. 35. The membrane 40 comprises a freestanding portion connected to a non-freestanding portion supported by the remaining portion of the support structure 802 (which may be referred to as a border). Details of the process flow are not described here or shown in FIGS. 34 and 35 because many variations are possible. A suitably adapted version of the process flow described above with reference to FIGS. 17-25 may be used for example.

More favorable stresses in the membrane 40 are achieved by providing a support structure 802 for which a difference between the thermal expansion coefficient of the support structure 802 and the base layer 60 is less than a difference between the thermal expansion coefficient of silicon and the base layer 60. Thus, the mismatch in thermal expansion coefficient is less than would be the case where a standard silicon wafer is used as the support structure 802. In an embodiment, the support structure 802 comprises sapphire. In an embodiment, the support structure 802 comprises a silicate glass, for example soda-lime glass. In an embodiment, the support structure 802 comprises quartz. These materials provide coefficients of thermal expansion that provide a good match to otherwise problematic base layer materials. In an embodiment, the base layer 60 comprises one or more of $MoSi_2$, $ZrSi_2$, B and $B_4C$, and the support structure 802 comprises sapphire. In an embodiment, the base layer 60 comprises $sp^2$ carbon (e.g. multilayer graphene) and the support structure 802 comprises quartz.

In any of the embodiments described above, particularly where a layer having relatively high reflectivity in the EUV (e.g. B) is used, the thickness of the base layer 60 may be selected to achieve destructive interference between EUV reflected from interfaces on opposite sides of the base layer 60. Overall reflectance is thereby reduced. In an embodiment, the thickness of the base layer 60 is selected to be one of the following: 9 nm+/−2 nm, preferably+/−1 nm, 16 nm+/−2 nm, preferably +/−1 nm, 22+/−2 nm, preferably +/−1 nm, and 29+/−2 nm, preferably +/−1 nm. Each of these thicknesses has been found to achieve destructive interference. The thicknesses have been found to be particularly effective where the base layer 60 comprises a silicide, particularly YSi2 or ZrSi2, and particularly where a further layer (e.g. capping layer second sub-layer 432) comprising B is used. Higher thicknesses causing destructive interference are also possible but increasing thickness will undesirably reduce EUV transmissivity.

In an embodiment the membrane 40 is applied as a pellicle or as part of a dynamic gas lock. Alternatively, the membrane 40 can be applied in other filtration areas such as identification, or for beam splitters. In an embodiment the dynamic gas lock is configured to block debris within the lithographic apparatus 100. In an embodiment the dynamic gas lock is positioned between the projection system PS and the substrate W. The dynamic gas lock reduces the possibility of particles from the substrate W or from near the substrate W reaching optical components in or around the projection system PS. Similarly, the dynamic gas lock can protect the illumination system IL. In an alternative embodiment the dynamic gas lock is positioned at the virtual source point IF. For example, the dynamic gas lock may be positioned between the source collector module SO and the illumination system IL.

At least in the case where the dynamic gas lock is positioned between the projection system PS and the substrate W, it has been found that a lifetime of the membrane 40 can be reduced due to contamination from species/molecules outgassed from the exposed substrate W. The problem is particularly acute where resists contain metallic components, such as metal-based inorganic resists, as is currently being proposed for EUV applications. Outgassed species from such resists can be relatively small and heavy (e.g. stannane) and therefore difficult to suppress using gas flows alone. In an embodiment, the lifetime of the membrane 40 is extended by providing a capping layer that has a relatively low affinity for metallic contaminants and/or high self-cleaning efficiency, at least on the side of the membrane 40 facing the substrate W. The capping layer may comprise $ZrO_2$, for example, or an oxide of one or more of the following: Ti, Hf, Y, Nb, Sc, Ta, V and La. In an embodiment, a purging gas flow, comprising $H_2$ for example, is also provided. It is expected that the combination of the capping layer and purging gas flow will allow dynamic gas locks between the projection system PS and the substrate W to have lifetimes greater than six months even for resists containing metals in EUV applications.

In an embodiment, the purging gas flow can be controlled to enhance the self-cleaning of the capping layer. This can be done for example by increasing the overall flow rate and/or pressure on the substrate side of the membrane 40. Upward-angled slits can be provided to improve a flow pattern towards the surface of the membrane 40. The flow can be controlled to minimize or avoid dead zones in the flow pattern at the surface of the membrane 40. Multiple gas inlets may provide flexibility to avoid undesirable pressure gradients within the dynamic gas lock volume and/or to provide a flow pattern that takes account of asymmetries in the membrane 40.

In an embodiment, the purging gas flow can be improved by creating additional hydrogen radicals and/or ions in the flow. This may be achieved for example using a hot metal filament (e.g. tungsten) or a microwave plasma. The hydrogen radicals and/or ions will enhance the cleaning rate of both organic and metallic contaminations.

In an embodiment, surfaces positioned near to the membrane 40 (e.g. an inner surface of a funnel structure) of the dynamic gas lock that will be encountered by contamination particles from the substrate W may be treated to increase gettering. Such surfaces may be coated for example with a Ru nano-layer, which will getter outgassed metal species (e.g. Sn). Treating the surfaces in this way reduces the amount of material that reaches the membrane 40 itself and thereby improves membrane lifetime.

In an embodiment membrane 40 may become contaminated with particles during manufacturing, transportation or use. Especially during production of a pellicle assembly comprising membrane 40 and a frame it is possible that the membrane becomes contaminated. However, for EUV lithography it is especially desired that such membrane is particle free; otherwise the film is considered damaged, leading to yield reduction and high costs.

Cleaning tools may therefore be needed to remove the particulate contamination from the surface of membrane 40. Herein it is proposed to use cleaning tools which make use of shaking membrane 40 and/or additional gas pressure differences to remove such particulate contamination without a risk to break the membrane. Removal of the particles added onto membrane 40 will improve the imaging performance of an EUV lithographic apparatus which uses a patterning device having a membrane 40 attached thereto via a detachable or permanently attached frame. It has been found that membrane 40 may handle large impact forces without breaking when it is protected in a specially designed transport carrier. By choosing a combination of underpressure and purge flows, it was possible to move particles away from the critical surface of the membrane 40.

Figure 33:
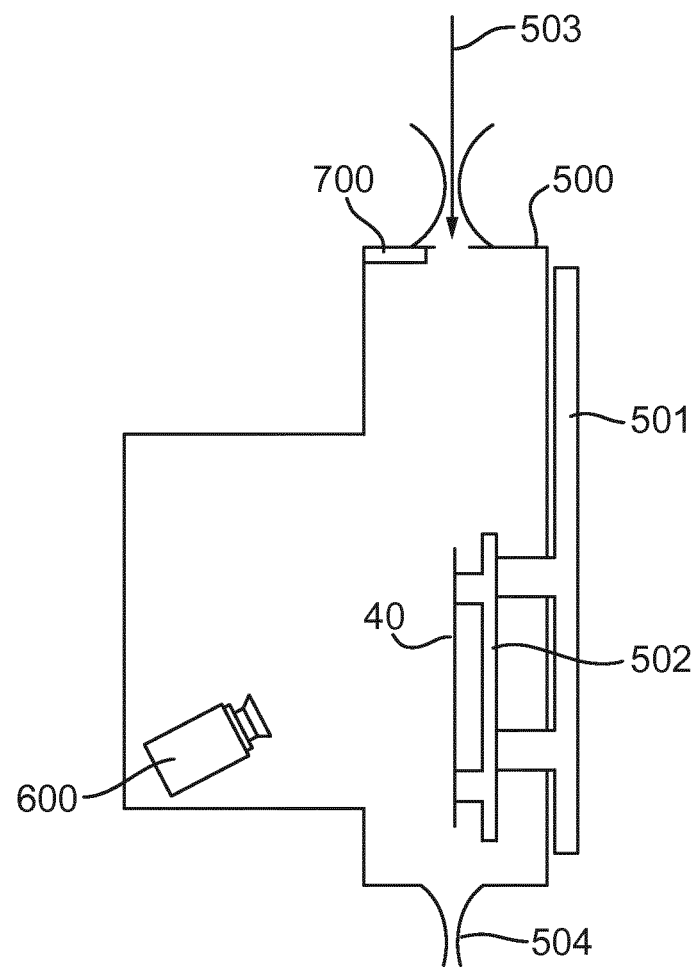
FIG. 33 schematically depicts a cleaning tool for monitoring and cleaning a membrane according to the invention.

FIG. 33 shows an example of a cleaning device for membrane 40. A vacuum chamber 500 is provided with a linear shaking stage 501 for shaking membrane 40 in order to loosen particles of diameter in the order of tenth of nanometers up to hundreds of microns or even millimeters size from its surface. The linear shaking stage 501 may include one or more coupling means to attach an interface plate 502 for supporting and coupling membrane 40 thereto. The interface place may be provided with attachment means, for example studs, such that a membrane frame may be easily attached and detached from the interface plate. At one side of the vacuum chamber 500 there is provided an inlet opening 503 through which a laminar gas flow is provided. An exhaust opening 504 may be provided at another side of the vacuum chamber 500, preferably opposite to the inlet opening 503 for the laminar gas flow. Through the exhaust opening 503 the laminar gas flows preferably parallel with the membrane surface such that the liberated particles driven by the laminar flow may be exhausted from vacuum chamber 500. It is possible to provide a vacuum source or a vacuum cleaner coupled to the exhaust opening to further aid the exhausting the particles and forming a laminar flow through the vacuum chamber (not shown in figure). The vacuum chamber 500 may be part of a transport carrier 800. Preferably, the linear shaking stage 501, the interface plate 502 and membrane 40 are oriented on a vertical direction along the gravity.

The cleaning device may also include an in line measurement method to detect the particles by using an inspection camera 600 and a line light source 700, such as a diffuse LED strip or a line laser. The inspection camera 600 may be provided at a position where is possible to capture any light from the line light source 700 which is scattered by the particles from the surface of membrane 40. For example, the inspection camera 600 may be provided opposite to the membrane surface in an optimal position and orientation to capture the scattered light, in order to detect the particles form the membrane surface 40. The line light source 700 may be provided at for example at a side of the inlet opening 503, such as to illuminate the particles that are on the membrane surface or are driven into the laminar flow by shaking the interface plate 502 with the linear shaking stage 501.

Alternatively, it is possible to place an acoustic speaker in front of a vertically mounted membrane 40 while keeping it in a down flow cabinet, such that particles can be removed by acceleration (not shown). By exciting the film with sound waves high accelerations can be reached to detach the contamination particles. In such way membrane 40 will not experience the high airflow speeds which may occur in linear accelerations and could potentially damage the membrane. Tests have shown that vacuum conditions are desirable to achieve the most effective particle release. It is believed this is at least partly due to the absence of water. In an embodiment, the above acoustic cleaning process is implemented in vacuum conditions using the following sequence: 1) providing an enclosed volume and pumping the enclosed volume to vacuum level; 2) venting the enclosed volume with gas (e.g. dry air); and 3) implementing the acoustic cleaning process (immediately after the venting with gas).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various photo resist layers may be replaced by non-photo resist layers that perform the same function.

The descriptions above are intended to be illustrative, not limiting. Thus it will be apparent to one skilled in the art that modifications may be made to the invention as described without departing from the scope of the claims set out below.

The invention claimed is:

1. A membrane for EUV lithography, the membrane comprising a stack having layers in the following order:
    a first capping layer comprising an oxide of a first metal;
    a base layer comprising a compound comprising a second metal and an additional element selected from the group consisting of Si, B, C and N; and
    a second capping layer comprising an oxide of a third metal,
    wherein the first metal is different from the second metal and the third metal is the same as or different from the first metal.

2. The membrane of claim 1, wherein either or both of the first metal and the third metal is selected from the group consisting of Nb, Zr, Ce, Ti, La, Y, and Al.

3. The membrane of claim 1, wherein in the compound of the base layer:
    the second metal is Mo and the additional element is Si;
    the second metal is Ru and the additional element is Si;
    the second metal is Zr and the additional element is Si;

the second metal is La and the additional element is Si;
the second metal is Sc and the additional element is Si;
the second metal is Y and the additional element is Si;
the second metal is Nb and the additional element is Si;
the second metal is Mo and the additional element is B;
the second metal is Ru and the additional element is B;
the second metal is Zr and the additional element is B;
the second metal is Nb and the additional element is B;
the second metal is Ti and the additional element is B;
the second metal is La and the additional element is B; or
the second metal is Zr and the additional element is C.

4. The membrane of claim 3, wherein in the compound of the base layer:
the second metal is Mo and the additional element is Si; or
the second metal is Ru and the additional element is Si.

5. The membrane of claim 3, wherein in the compound of the base layer:
the second metal is Mo and the additional element is B; or
the second metal is Ru and the additional element is B.

6. The membrane of claim 1, wherein in the base layer the compound comprising the second metal and the additional element consists of the second metal and the additional element.

7. The membrane of claim 1, wherein:
the first metal is Zr;
the second metal is Mo and the additional element is Si; and
the third metal is Zr.

8. The membrane of claim 1, wherein:
the oxide of the first metal is a mixed metal oxide comprising the first metal and one or more further metals;
the oxide of the third metal is a mixed metal oxide comprising the second metal and one or more further metals; or
the oxide of the first metal is a mixed metal oxide comprising the first metal and one or more further metals and the oxide of the third metal is a mixed metal oxide comprising the third metal and one or more further metals.

9. The membrane of claim 1, wherein the base layer comprises plural base layer sub-layers, at least one of the base layer sub-layers comprising the compound comprising the second metal and the additional element.

10. The membrane of claim 9, wherein:
the base layer comprises a base layer first sub-layer, a base layer second sub-layer and a base layer third sub-layer;
the base layer second sub-layer is disposed between the base layer first sub-layer and the base layer third sub-layer and comprises the compound comprising the second metal and the additional element;
the base layer first sub-layer comprises an oxide of the additional element; and the base layer third sub-layer comprises an oxide of the additional element.

11. The membrane of claim 10, wherein at least a portion of the base layer first sub-layer is in contact with the oxide of the first metal in the first capping layer.

12. The membrane of claim 10, wherein at least a portion of the base layer third sub-layer is in contact with the oxide of the third metal in the second capping layer.

13. The membrane of claim 1, wherein at least a portion of the compound comprising the second metal and the additional element in the base layer is in contact with either or both of the oxide of the first metal in the first capping layer and the oxide of the third metal in the second capping layer.

14. The membrane of claim 1, wherein the first capping layer comprises a first capping layer first sub-layer and a first capping layer second sub-layer, the first capping layer first sub-layer comprising the oxide of the first metal and the first capping layer second sublayer comprising a first capping layer deposited oxide, the first capping layer second sub-layer positioned between the first capping layer first sub-layer and the base layer.

15. The membrane of claim 14, wherein the first capping layer deposited oxide comprises an oxide of silicon.

16. The membrane of claim 1, wherein the second capping layer comprises a second capping layer first sub-layer and a second capping layer second sub-layer, the second capping layer first sub-layer comprising the oxide of the third metal and the second capping layer second sub-layer comprising a second capping layer deposited oxide,
the second capping layer second sub-layer positioned between the second capping layer first sub-layer and the base layer.

17. The membrane of claim 16, wherein the second capping layer deposited oxide comprises an oxide of silicon.

18. The membrane of claim 1, wherein the first capping layer and the second capping layer each has a thickness of less than 5 nm.

19. The membrane of claim 1, wherein the base layer has a thickness equal to or greater than 8 nm.

20. The membrane of claim 19, wherein the thickness of the base layer is selected to achieve destructive interference between EUV reflections from the first capping layer and the second capping layer.

* * * * *

UNITED STATES PATENT AND TRADEMARK OFFICE
CERTIFICATE OF CORRECTION

PATENT NO. : 10,908,496 B2
APPLICATION NO. : 16/093537
DATED : February 2, 2021
INVENTOR(S) : Maxim Aleksandrovich Nasalevich et al.

It is certified that error appears in the above-identified patent and that said Letters Patent is hereby corrected as shown below:

On the Title Page

Item (56) References Cited:
Please correct "JPH11109603, 04/1999" to "JPH11109608, 04/1999" in the FOREIGN PATENT DOCUMENTS Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*